(12) United States Patent
Kim et al.

(10) Patent No.: US 11,683,951 B2
(45) Date of Patent: Jun. 20, 2023

(54) DISPLAY PANEL AND DISPLAY DEVICE

(71) Applicant: SAMSUNG DISPLAY CO., LTD., Yongin-si (KR)

(72) Inventors: Kyungmin Kim, Yongin-si (KR); Junhyeong Park, Yongin-si (KR); Jaemin Shin, Yongin-si (KR); Byeonghee Won, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 188 days.

(21) Appl. No.: 17/339,866

(22) Filed: Jun. 4, 2021

(65) Prior Publication Data

US 2022/0085327 A1 Mar. 17, 2022

(30) Foreign Application Priority Data

Sep. 14, 2020 (KR) .......................... 10-2020-0117774

(51) Int. Cl.
*H10K 50/844* (2023.01)
*H01L 51/52* (2006.01)

(52) U.S. Cl.
CPC .............................. *H01L 51/5253* (2013.01)

(58) Field of Classification Search
CPC ... H01L 51/5253–5256; H01L 27/3276; H01L 27/3246; H01L 27/3258; H01L 27/3244; H01L 27/3248; H01L 27/326
See application file for complete search history.

(56) References Cited

U.S. PATENT DOCUMENTS

| | | | |
|---|---|---|---|
| 10,692,949 B2 | 6/2020 | Lee et al. | |
| 11,329,070 B2* | 5/2022 | Park | H01L 27/124 |
| 2020/0111987 A1 | 4/2020 | Kim et al. | |
| 2020/0235338 A1 | 7/2020 | Kim et al. | |
| 2020/0350520 A1* | 11/2020 | Yun | H01L 51/003 |
| 2021/0384465 A1* | 12/2021 | Park | H01L 27/326 |
| 2022/0271258 A1* | 8/2022 | Wang | H01L 51/56 |

FOREIGN PATENT DOCUMENTS

| | | |
|---|---|---|
| JP | 2010-192215 A | 9/2010 |
| KR | 10-2018-0025048 A | 3/2018 |
| KR | 10-2018-0027701 A | 3/2018 |
| KR | 10-2018-0053220 A | 5/2018 |
| KR | 10-2018-0062155 A | 6/2018 |
| KR | 10-2019-0109690 A | 9/2019 |
| KR | 10-2020-0039085 A | 4/2020 |

* cited by examiner

*Primary Examiner* — Shaun M Campbell
(74) *Attorney, Agent, or Firm* — Lewis Roca Rothgerber Christie LLP

(57) ABSTRACT

A display panel is provided, the display panel including: a substrate including: a front display area; a first side display area; a second side display area; a corner display area between the first side display area and the second side display area; and an intermediate display area between the front display area and the corner display area; an intermediate display element including a pixel electrode in the intermediate display area; a lower layer between the substrate and the pixel electrode, the lower layer including a groove; and a dam portion on the lower layer and extending to define a boundary between the intermediate display area and the corner display area, wherein the groove includes a first groove and a second groove, the first groove extending in parallel with the dam portion, and the second groove extending in a direction crossing a direction in which the dam portion.

21 Claims, 23 Drawing Sheets

DISPLAY PANEL AND DISPLAY DEVICE

CROSS-REFERENCE TO RELATED APPLICATION

This application claims priority to and the benefit of Korean Patent Application No. 10-2020-0117774, filed on Sep. 14, 2020, in the Korean Intellectual Property Office (KIPO), the entire content of which is hereby incorporated by reference.

BACKGROUND

1. Field

One or more aspects of embodiments of the present disclosure relate to a display panel including an enlarged display area for displaying an image and a display device including the display panel.

2. Description of Related Art

Mobile electronic devices are widely used. Recently, tablet personal computers (PCs), in addition to small electronic devices, such as mobile phones, have been widely used as mobile electronic devices.

Such mobile electronic devices include a display device to provide a user with various suitable functions, for example, a function for displaying visual information such as images or pictures. Recently, as other parts for driving a display device have been miniaturized, a ratio of the display device in the electronic device has gradually increased, and a structure that is bendable at a certain angle in a flat state has also been developed.

In addition, the display device may include a display area for displaying an image, and a technology for further expanding a portion occupied by the display area has been studied.

SUMMARY

Aspects of one or more embodiments are directed towards a display panel including an enlarged display area for displaying an image and a display device including the display panel.

Aspects of one or more embodiments are directed towards a display panel including a bendable corner display area corresponding to corners of a flat front display area of the display panel, and a display device including the display panel.

Additional aspects will be set forth in part in the description which follows and, in part, will be apparent from the description, or may be learned by practice of the presented embodiments of the disclosure.

According to one or more embodiments, a display panel includes a substrate including a front display area, a first side display area connected to the front display area in a first direction, a second side display area connected to the front display area in a second direction crossing the first direction, a corner display area arranged between the first side display area and the second side display area, the corner display surrounding the front display area, and an intermediate display area arranged between the front display area and the corner display area, an intermediate display element in the intermediate display area, the intermediate display element including a pixel electrode, a lower layer between the substrate and the pixel electrode, the lower layer including a groove concave in a thickness direction of the substrate, and a dam portion on the lower layer, extending to define a boundary between the intermediate display area and the corner display area, and protruding in the thickness direction of the substrate, wherein the groove includes a first groove and a second groove, the first groove extending in parallel with the dam portion, and the second groove extending in a direction crossing a direction in which the dam portion extends in the intermediate display area.

The corner display area may include a plurality of extension areas each extending from the intermediate display area, a through portion may be between the plurality of extension areas that are adjacent to each other, the intermediate display element may include a first intermediate display element and a second intermediate display element each facing the plurality of extension areas, and the second groove may extend between the first intermediate display element and the second intermediate display element.

A plurality of intermediate display elements may be in the intermediate display area, and the second groove may surround at least a portion of each of the plurality of intermediate display elements.

The display panel may further include a corner display element in the corner display area, a thin-film encapsulation layer covering the corner display element and the intermediate display element, the thin-film encapsulation layer including at least one inorganic encapsulation layer and at least one organic encapsulation layer. The at least one organic encapsulation layer is separated based on the dam portion, and the second groove may be filled with the at least one organic encapsulation layer.

The display panel may further include an auxiliary dam portion on the lower layer, arranged in the intermediate display area, and protruding in the thickness direction of the substrate. A first distance from an upper surface of the substrate to an upper surface of the auxiliary dam portion may be less than a second distance from the upper surface of the substrate to an upper surface of the dam portion. The auxiliary dam portion may extend in parallel with the dam portion, the auxiliary dam portion including a first auxiliary dam portion and a second auxiliary dam portion that are separated from each other.

The display panel may further include a driving circuit arranged in the intermediate display area, the driving circuit overlapping with the intermediate display element, a pixel circuit in the front display area, and a connection line connected to the pixel circuit, the connection line extending from the front display area to the intermediate display area. The connection line may be connected to the pixel electrode.

The lower layer may include a lower inorganic pattern layer, and an insulating layer covering an edge of the lower inorganic pattern layer, the insulating layer including a hole exposing at least a portion of the lower inorganic pattern layer. The groove may be defined by the lower inorganic pattern layer and the hole.

The display panel may further include a line on the substrate. The line may be covered with the lower inorganic pattern layer and the insulating layer.

The lower layer may include an insulating layer including a concave portion, and the second groove may be defined by the concave portion of the insulating layer.

The display panel may further include an inorganic pattern layer on both sides of the first groove, the inorganic pattern layer including a pair of protruding tips protruding in a center direction of the groove.

According to one or more embodiments, a display panel includes a substrate including a front display area and an intermediate display area, the intermediate display area surrounding at least a portion of the front display area, a pixel circuit in the front display area, a driving circuit in the intermediate display area, an intermediate display element overlapping with the driving circuit, the intermediate display element including a pixel electrode connected to the pixel circuit, a lower layer between the substrate and the pixel electrode, the lower layer including a groove concave in a thickness direction of the substrate, a dam portion on the lower layer, arranged outside the intermediate display area, and protruding in the thickness direction of the substrate, and a thin-film encapsulation layer covering the intermediate display element and extending to the dam portion, the thin-film encapsulation layer including at least one inorganic encapsulation layer and at least one organic encapsulation layer, wherein the groove includes a first groove and a second groove, the first groove extending in parallel with the dam portion, and the second groove extending in a direction crossing a direction in which the dam portion extends in the intermediate display area, and the second groove is filled with the at least one organic encapsulation layer.

According to one or more embodiments, a display panel includes a display panel including a substrate including a front display area, a corner display area arranged and bent at a corner of the front display area, and an intermediate display area between the front display area and the corner display area, an intermediate display element in the intermediate display area, the intermediate display element including a pixel electrode, a lower layer between the substrate and the pixel electrode, the lower layer including a groove concave in a thickness direction of the substrate, and a dam portion on the lower layer, extending to define a boundary between the intermediate display area and the corner display area, and protruding in the thickness direction of the substrate, and a cover window covering the display panel, wherein the groove includes a first groove and a second groove, the first groove extending in parallel with the dam portion, and the second groove extending in a direction crossing a direction in which the dam portion extends, in the intermediate display area.

The corner display area may include a plurality of extension areas each extending from the intermediate display area. The intermediate display element may include a first intermediate display element and a second intermediate display element each facing the plurality of extension areas. The second groove may extend between the first intermediate display element and the second intermediate display element.

A plurality of intermediate display elements may be in the intermediate display area, and the second groove may surround at least a portion of each of the plurality of intermediate display elements.

The display panel may further include a corner display element in the corner display area, and a thin-film encapsulation layer covering the corner display element and the intermediate display element, the thin-film encapsulation layer including at least one inorganic encapsulation layer and at least one organic encapsulation layer. The at least one organic encapsulation layer is separated based on the dam portion, and the second groove may be filled with the at least one organic encapsulation layer.

The display panel may further include an auxiliary dam portion on the lower layer, arranged in the intermediate display area, and protruding in the thickness direction of the substrate. A first distance from an upper surface of the substrate to an upper surface of the auxiliary dam portion may be less than a second distance from the upper surface of the substrate to an upper surface of the dam portion. The auxiliary dam portion may extend in parallel with the dam portion and may include a first auxiliary dam portion and a second auxiliary dam portion that are separated from each other.

The display panel may further include a driving circuit arranged in the intermediate display area, the driving circuit overlapping with the intermediate display element, a pixel circuit in the front display area, and a connection line connected to the pixel circuit, the connection line extending from the front display area to the intermediate display area. The connection line may be connected to the pixel electrode.

The lower layer may include a lower inorganic pattern layer, and an insulating layer covering an edge of the lower inorganic pattern layer, the insulating layer including a hole exposing at least a portion of the lower inorganic pattern layer. The groove may be defined by the lower inorganic pattern layer and the hole.

The lower layer may include an insulating layer including a concave portion, and the second groove may be defined by the concave portion of the insulating layer.

According to one or more embodiments, the substrate may further include a first side display area connected to the front display area in a first direction and bent with a first curvature radius, and a second side display area connected to the front display area in a second direction crossing the first direction and bent with a second curvature radius that is different from the first curvature radius. The corner display area may be between the first side display area and the second side display area, and may surround the front display area.

According to one or more embodiments, a display panel includes a substrate including: a front display area, a first side display area extending in a first direction from the front display area, a second side display area extending in a second direction crossing the first direction, from the front display area, a corner display area between the first side display area and the second side display area, and an intermediate display area between the front display area and the corner display area, at least one pixel in the intermediate display area, the at least one pixel including a display element that includes a pixel electrode, a lower layer between the substrate and the pixel electrode, the lower layer including a groove concave in a thickness direction of the substrate, and a dam portion on the lower layer, arranged to define a boundary between the at least one pixel and the corner display area, and protruding in the thickness direction of the substrate, wherein the at least one pixel includes a first intermediate pixel and a second intermediate pixel each facing the corner display area, and the groove includes a first groove arranged in parallel with the dam portion, and a second groove between the first intermediate pixel and the second intermediate pixel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
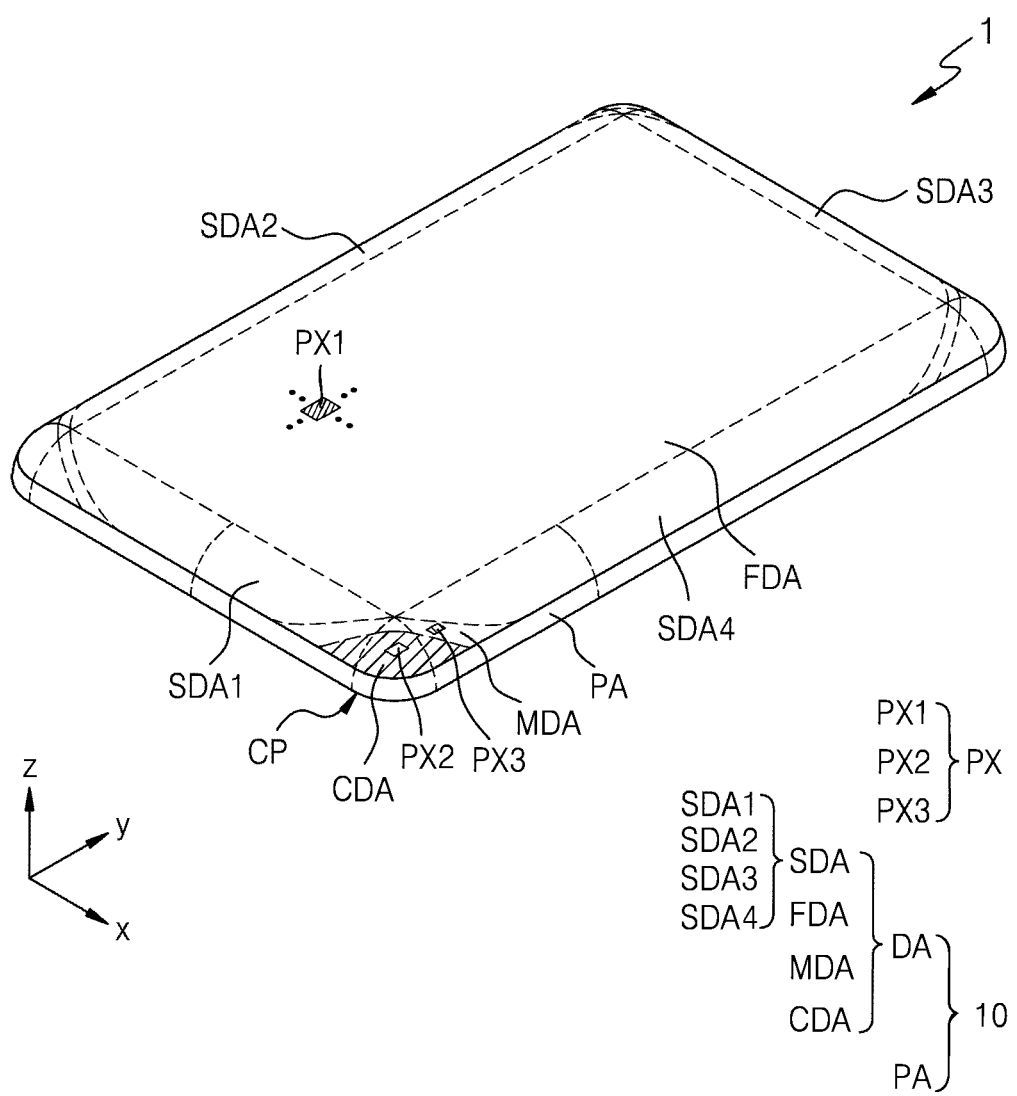
FIG. 1 is a perspective view schematically illustrating a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one selected from a, b, and c", "at least one of a, b or c", or the like indicates only a, only b, only c, both a and b, both a and c, both b and c, all of a, b, and c, or variations thereof.

Various suitable modifications may be applied to the present embodiments, and certain embodiments will be illustrated in the drawings and described in more detail in the detailed description section. The effect and features of the present embodiments, and a method of achieving the same, will be clearer referring to the detailed descriptions below with the drawings. However, the present embodiments may be implemented in various suitable forms, not by being limited to the embodiments presented below.

Hereinafter, the disclosure will be described in more detail by explaining certain embodiments of the disclosure with reference to the attached drawings. Like reference numerals in the drawings denote like elements, and redundant explanations are omitted.

In the embodiments below, it will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "includes," "including," "comprises," and/or "comprising," when used herein specify the presence of stated features, steps, operations, elements, and/or components, but do not preclude the presence or addition of one or more other features, steps, operations, elements, components, and/or groups thereof.

Further, the use of "may" when describing embodiments of the present disclosure refers to "one or more embodiments of the present disclosure".

In the embodiments below, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
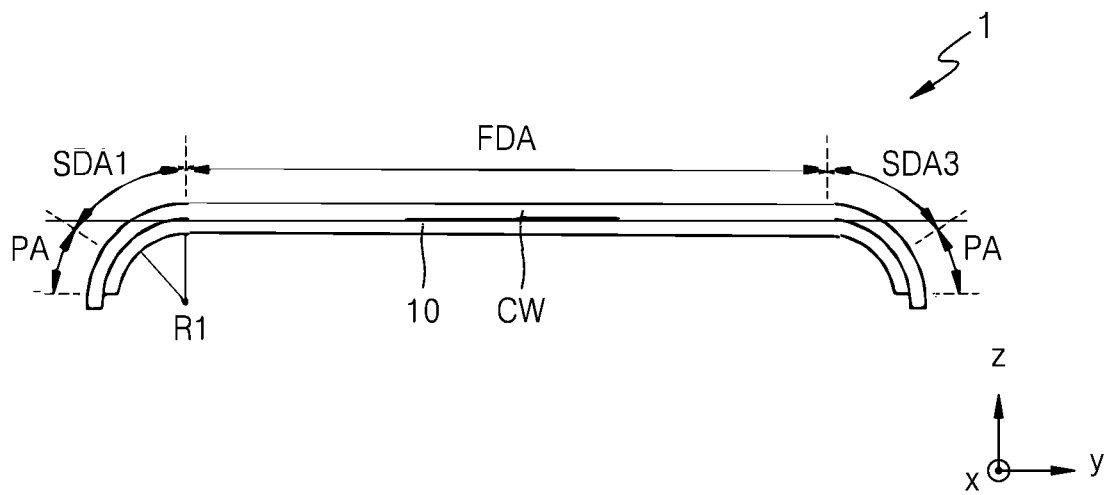
FIGS. 2A, 2B, and 2C are cross-sectional views each schematically illustrating a display device according to an embodiment.
Figure 2B:
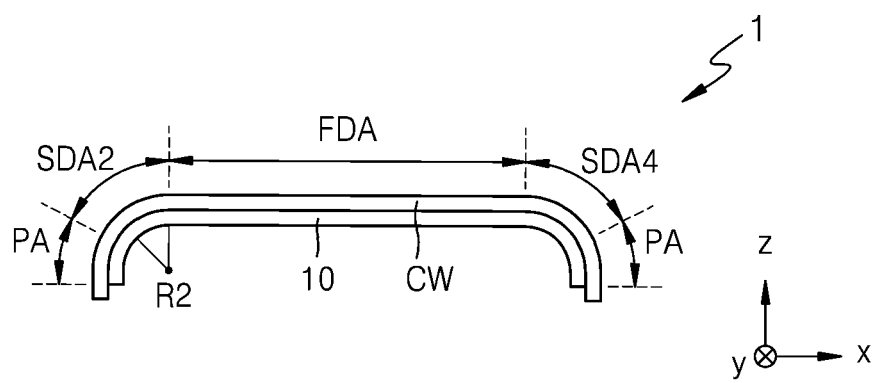
Figure 2C:
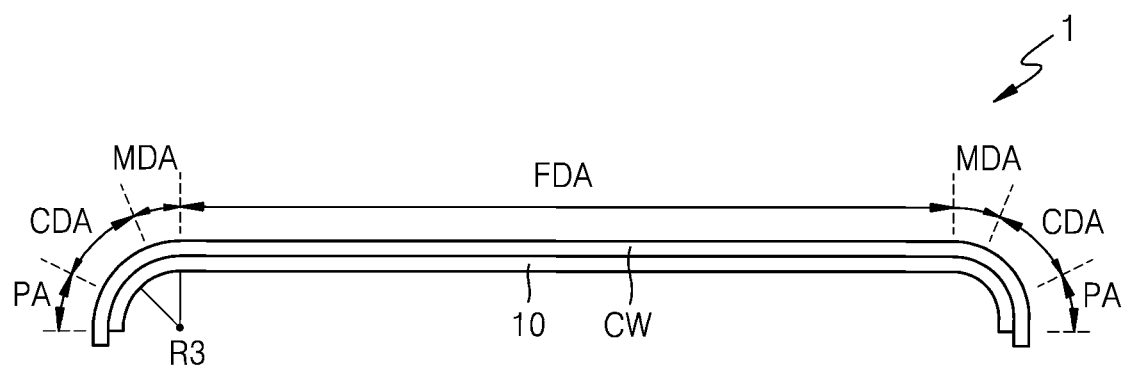

FIG. 1 is a perspective view schematically illustrating a display device 1 according to an embodiment. FIGS. 2A, 2B, and 2C are cross-sectional views each schematically illustrating the display device 1 according to an embodiment. FIG. 2A is a cross-sectional view of the display device 1 viewed in the y direction of FIG. 1. FIG. 2B is a cross-sectional view of the display device 1 viewed in the x direction of FIG. 1. FIG. 2C is a cross-sectional view of the display device 1 in which corner display areas CDA are at opposite sides of a front display area FDA.

Referring to FIGS. 1, 2A, 2B, and 2C, the display device 1 is a device that displays a moving image or a still image, and may be used in portable electronic devices such as mobile phones, smart phones, tablet PCs, mobile communication terminals, electronic notebooks, electronic books, portable multimedia players (PMPs), navigations, and/or ultra-mobile PCs (UMPCs) or may be used as a display screen of various products such as televisions, laptops, monitors, billboards, Internet of things (IoT), and/or the like. In addition, the display device 1 according to an embodiment may be used in wearable devices such as smart watches, watch phones, glass-type displays, and/or head-mounted displays (HMDs). In addition, the display device 1 according to an embodiment may be used as a vehicle's dashboard, a center information display (CID) located at a vehicle's center fascia or dashboard, a room mirror display covering for a vehicle's side-view mirror, or a display, which is located at the back of a front seat, as entertainment for a passenger in a back seat of a vehicle.

In an embodiment, the display device 1 may have a long side in a first direction and a short side in a second direction. Here, the first direction and the second direction may be directions crossing each other. For example, the first direction and the second direction may form an acute angle to each other. As another example, the first direction and the second direction may form an obtuse angle or a right angle. Hereinafter, a detailed description will be given focusing on the case where the first direction (e.g., the y direction or the −y direction) and the second direction (e.g., the x direction and the −x direction) form a right angle to each other.

In another embodiment, a side of the display device 1 in the first direction (e.g., the y direction or the −y direction) may be equal or substantially equal in length to a side of the display device 1 in the second direction (e.g., the x direction or the −x direction). In another embodiment, the display device 1 may have a short side in the first direction (e.g., the y direction or the −y direction) and a long side in the second direction (e.g., the x direction or the −x direction).

A corner where the long side in the first direction (e.g., the y direction or the −y direction) and the short side in the second direction (e.g., the x direction or the −x direction) meet, cross, or intersect may be rounded with a certain curvature.

The display device 1 may include a display panel 10 and a cover window CW. In this case, the cover window CW may protect the display panel 10.

The cover window CW may be flexible. The cover window CW may protect the display panel 10 while easily bending according to an external force without generating cracks or the like. The cover window CW may include glass, sapphire, or plastic. The cover window CW may include, for example, ultra-thin glass (UTG) or colorless polyimide (CPI). In an embodiment, the cover window CW may have a structure in which a flexible polymer layer is on one surface of a glass substrate, or the cover window CW may include only a polymer layer.

The display panel 10 may be below the cover window CW. In one or more embodiments, the display panel 10 may be attached to the cover window CW with a transparent adhesive member such as an optically clear adhesive (OCA) film.

The display panel 10 may include a display area DA for displaying an image and a peripheral area PA surrounding the display area DA. The display area DA may include a plurality of pixels PX. An image may be displayed by the plurality of pixels PX. Each of the pixels PX may include subpixels. For example, the pixels PX may each include a red subpixel, a green subpixel, and a blue subpixel. Alternatively, the pixels PX may each include a red subpixel, a green subpixel, a blue subpixel, and a white subpixel.

The display area DA may include the front display area FDA, a side display area SDA, a corner display area CDA, and an intermediate display area MDA. The pixels PX in each of the front display area FDA, the side display area SDA, the corner display area CDA, and the intermediate display area MDA may display an image. In an embodiment, each of the pixels PX of the front display area FDA, the side display area SDA, the corner display area CDA, and the intermediate display area MDA may provide an independent image. In another embodiment, each of the pixels PX of the front display area FDA, the side display area SDA, the corner display area CDA, and the intermediate display area MDA may provide a portion of an image.

The front display area FDA is a flat display area and may include a first pixel PX1 including a display element. In an embodiment, the front display area FDA may provide most of images (e.g., more of images than the side display area SDA, the corner display area CDA, and the intermediate display area MDA). In one or more embodiments, a plurality of first pixels PX1 each including a display element may be in the front display area FDA to display an image or a portion of an image in the front display area FDA.

In an embodiment, the display element may include a light-emitting diode. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. In an embodiment, a size of the light-emitting diode may be a microscale or a nanoscale. For example, the light-emitting diode may include a micro light-emitting diode. Alternatively, the light-emitting diode may include a nanorod light-emitting diode. The nanorod light-emitting diode may include gallium nitride (GaN). In an embodiment, a color conversion layer may be on the nanorod light-emitting diode. The color conversion layer may include quantum dots.

For convenience of description, a case where the light-emitting diode includes an organic light-emitting diode will now be described in more detail. In an embodiment, the organic light-emitting diode may include a pixel electrode, an emission layer including an organic material, and an opposite electrode.

A pixel PX including a display element may be in the side display area SDA. Thus, an image may be displayed in the side display area SDA. In an embodiment, the side display area SDA may include a first side display area SDA1, a second side display area SDA2, a third side display area SDA3, and a fourth side display area SDA4. In some embodiments, at least one of the first side display area SDA1, the second side display area SDA2, the third side display area SDA3, or the fourth side display area SDA4 may be omitted.

Each of the first side display area SDA1 and the third side display area SDA3 may be connected to the front display area FDA in the first direction (e.g., the y direction or the −y direction). For example, the first side display area SDA1 may be connected to the front display area FDA in the −y direction, and the third side display area SDA3 may be connected to the front display area FDA in the y direction.

Each of the first side display area SDA1 and the third side display area SDA3 may bend with a radius of curvature (i.e., a curvature radius). In an embodiment, the first side display area SDA1 and the third side display area SDA3 may have different curvature radii from each other. In another embodiment, the first side display area SDA1 and the third side display area SDA3 may have the same curvature radius as each other. Hereinafter, a case where the first side display area SDA1 and the third side display area SDA3 have the same curvature radius (e.g., a first curvature radius R1) will be described in more detail. In addition, because the first side display area SDA1 is the same as or similar to the third side display area SDA3, a detailed description of the first side display area SDA1 will be given and a corresponding description of the third side display area SDA3 may not be repeated.

Each of the second side display area SDA2 and the fourth side display area SDA4 may be connected to the front display area FDA in the second direction (e.g., the x direction or the −x direction). For example, the second side display area SDA2 may be connected to the front display area FDA in the −x direction, and the fourth side display area SDA4 may be connected to the front display area FDA in the x direction.

Each of the second side display area SDA2 and the fourth side display area SDA4 may bend with a curvature radius. In an embodiment, the second side display area SDA2 and the fourth side display area SDA4 may have different curvature radii from each other. In another embodiment, the second side display area SDA2 and the fourth side display area SDA4 may have the same curvature radius as each other. Hereinafter, a case where the second side display area SDA2 and the fourth side display area SDA4 have the same curvature radius of a second curvature radius R2 will be described in more detail. In addition, because the second side display area SDA2 and the fourth side display area SDA4 are the same as or similar to each other, a detailed description of the second side display area SDA2 will be given and a corresponding description of the fourth side display area SDA4 may not be repeated.

In an embodiment, the first curvature radius R1 of the first side display area SDA1 may be different from the second curvature radius R2 of the second side display area SDA2. For example, the first curvature radius R1 may be less than the second curvature radius R2. As another example, the first curvature radius R1 may be greater than the second curvature radius R2. In another embodiment, the first curvature radius R1 of the first side display area SDA1 may be the same as (i.e., equal to) the second curvature radius R2 of the second side display area SDA2. Hereinafter, a case where the first curvature radius R1 is greater than the second curvature radius R2 will be described in more detail.

The corner display area CDA may be at a corner of the front display area FDA and may be bendable. In other words, the corner display area CDA may correspond to (e.g., be at) a corner portion CP. Here, the corner portion CP, which is at a corner of the display area DA, may be a portion where a long side in the first direction (e.g., the y direction or the −y direction) and a short side in the second direction (e.g., the x direction or the −x direction) meet, cross, or intersect. In addition, the corner display area CDA may be between neighboring side display areas SDA (e.g., two adjacent side display areas selected from among the first side display area SDA1, the second side display area SDA2, the third side display area SDA3, and the fourth side display area SDA4). For example, the corner display area CDA may be between the first side display area SDA1 and the second side display area SDA2. Alternatively, the corner display area CDA may be between the second side display area SDA2 and the third side display area SDA3, or may be between the third side display area SDA3 and the fourth side display area SDA4, or may be between the fourth side display area SDA4 and the first side display area SDA1. Thus, the side display area SDA and the corner display area CDA may surround the front display area FDA and may be bent.

A second pixel PX2 including a display element may be in the corner display area CDA. Thus, an image may be displayed in the corner display area CDA. In one or more embodiments, a plurality of second pixels PX2 each including a display element may be in the corner display area CDA to display an image or a portion of an image in the corner display area CDA.

When the first curvature radius R1 of the first side display area SDA1 is different from the second curvature radius R2 of the second side display area SDA2, a curvature radius of the corner display area CDA may be gradually changed. In an embodiment, when the first curvature radius R1 of the first side display area SDA1 is greater than the second curvature radius R2 of the second side display area SDA2, a curvature radius of the corner display area CDA may gradually decrease in a direction from the first side display area SDA1 to the second side display area SDA2. For example, a third curvature radius R3 of the corner display area CDA may be greater than the second curvature radius R2 and less than the first curvature radius R1.

The intermediate display area MDA may be between the corner display area CDA and the front display area FDA. In an embodiment, the intermediate display area MDA may extend between the side display area SDA and the corner display area CDA. For example, the intermediate display area MDA may extend between the first side display area SDA1 and the corner display area CDA. In addition, the intermediate display area MDA may extend between the second side display area SDA2 and the corner display area CDA.

The intermediate display area MDA may include a third pixel PX3. In addition, in an embodiment, a driving circuit for providing an electrical signal or a power line for providing a voltage may be in the intermediate display area MDA, and the third pixel PX3 may overlap with the driving circuit or the power line. In this case, a display element of the third pixel PX3 may be above the driving circuit or the power line. In some embodiments, the driving circuit or the power line may be in the peripheral area PA, and the third pixel PX3 may not overlap with the driving circuit or the power line. In one or more embodiments, a plurality of third pixel PX3 each including a display element may be in the intermediate display area MDA to display an image or a portion of an image in intermediate display area MDA.

In the present embodiment, the display device 1 may display an image not only in the front display area FDA but also in the side display area SDA, the corner display area CDA, and the intermediate display area MDA. Accordingly, a ratio of the display area DA (e.g., a ratio of the display area DA to a non-display area) in the display device 1 may increase. In addition, the display device 1 may include the corner display area CDA that bends at a corner thereof and displays an image, thereby improving aesthetics.

Figure 3:
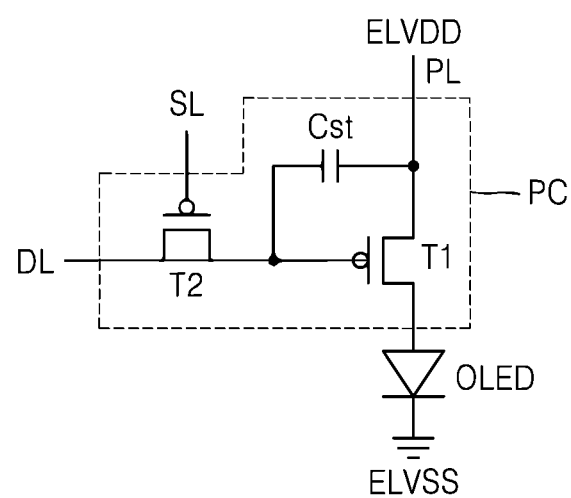
FIG. 3 is an equivalent circuit diagram schematically illustrating a pixel circuit for a display panel according to an embodiment.

FIG. 3 is an equivalent circuit diagram schematically illustrating a pixel circuit PC for a display panel according to an embodiment.

Referring to FIG. 3, the pixel circuit PC may be connected to a display element, for example, an organic light-emitting diode OLED.

The pixel circuit PC may include a driving thin-film transistor T1, a switching thin-film transistor T2, and a storage capacitor Cst. In addition, the organic light-emitting diode OLED may emit, for example, red light, green light, or blue light, or may emit red light, green light, blue light, or white light.

The switching thin-film transistor T2 may be connected to a scan line SL and a data line DL and may transmit a data signal or a data voltage received via the data line DL to the driving thin-film transistor T1 based on a scan signal or a switching voltage received via the scan line SL. The storage capacitor Cst may be connected to the switching thin-film transistor T2 and a driving voltage line PL and may store a voltage corresponding to the difference between a voltage transmitted from the switching thin-film transistor T2 and a first power voltage ELVDD applied to the driving voltage line PL.

The driving thin-film transistor T1 may be connected between the driving voltage line PL and the storage capacitor Cst and may control a driving current flowing from the driving voltage line PL to the organic light-emitting diode OLED to correspond to a voltage stored in the storage capacitor Cst. The organic light-emitting diode OLED may emit light having a certain luminance according to the driving current. An opposite electrode (e.g., the cathode) of the organic light-emitting diode OLED may be configured to receive a second power voltage ELVSS.

FIG. 3 shows that the pixel circuit PC includes two thin-film transistors and one storage capacitor, but the pixel circuit PC may include three or more thin-film transistors.

Figure 4:
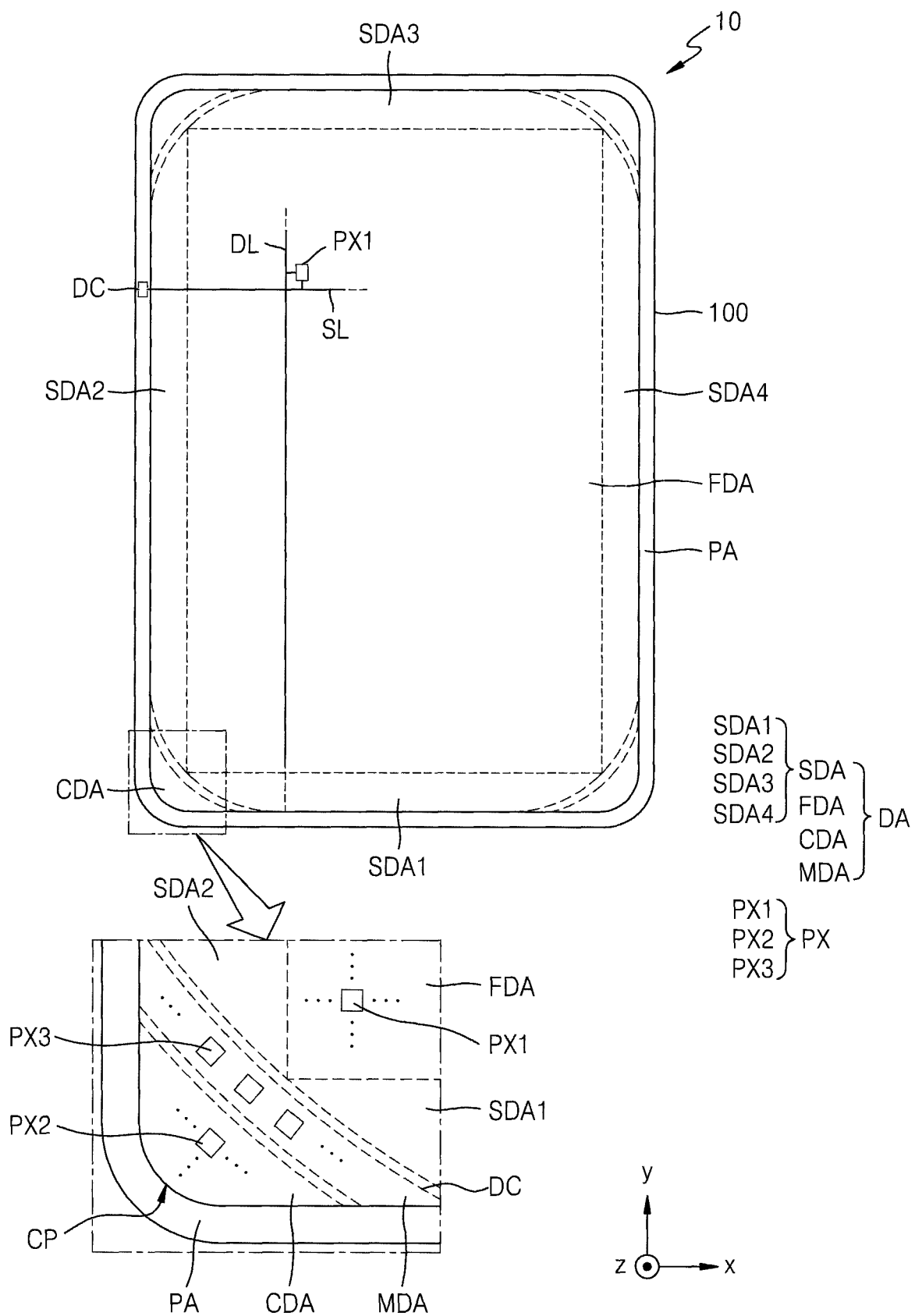
FIG. 4 is a plan view schematically illustrating a display panel according to an embodiment.

FIG. 4 is a plan view of the display panel 10 according to an embodiment. FIG. 4 is a plan view schematically illustrating a shape of the display panel 10 in an unbent shape before a corner display area CDA of the display panel 10 bends.

Referring to FIG. 4, the display panel 10 may include a display element. For example, the display panel 10 may be an organic light-emitting display panel in which an organic light-emitting diode including an organic emission layer is used. Alternatively, the display panel 10 may be a light-emitting diode display panel in which a light-emitting diode (LED) is used. A size of the LED may be a microscale or a nanoscale. Alternatively, the display panel 10 may be a quantum dot light-emitting display panel in which a quantum dot light-emitting diode including a quantum dot emission layer is used. Alternatively, the display panel 10 may be an inorganic light-emitting display panel in which an inorganic light-emitting device including an inorganic semiconductor is used. A detailed description where the display panel 10 is an organic light-emitting display panel in which an organic light-emitting diode is used as a display element will be given below.

The display panel 10 may include a display area DA and a peripheral area PA. The display area DA may be an area in which a plurality of pixels PX display an image, and the peripheral area PA may be an area at least partially surrounding the display area DA. The display area DA may include a front display area FDA, a side display area SDA, the corner display area CDA, and an intermediate display area MDA. In one or more embodiments, the peripheral area PA may not include pixels PX to display an image or a portion of an image. However, the present disclosure is not limited thereto.

Each of the pixels PX may include a plurality of subpixels, and the subpixels may emit light of a certain color by using an organic light-emitting diode as a display element. The term "subpixel" used herein may be a minimum unit for implementing an image and may refer to an emission area. When an organic light-emitting diode is employed as a display element, the emission area may be defined by an opening of a pixel-defining layer. This will be described in more detail below.

The organic light-emitting diode may emit, for example, red light, green light, or blue light. The organic light-emitting diode may be connected to a pixel circuit including a thin-film transistor and a storage capacitor.

The display panel 10 may include a substrate 100 and a multilayer film on the substrate 100. In this case, the display area DA and the peripheral area PA may be defined on the substrate 100 and/or the multilayer film. In other words, the substrate 100 and/or the multilayer film may include the front display area FDA, the side display area SDA, the corner display area CDA, the intermediate display area MDA, and the peripheral area PA.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate. The substrate 100 including the polymer resin may be flexible, rollable, and/or bendable. The substrate 100 may have a multilayer structure including a base layer including the polymer resin and a barrier layer.

The peripheral area PA may be a non-display area for not providing an image. A driving circuit DC for providing an electrical signal to the pixels PX, a power line for providing power, and the like may be in the peripheral area PA. The driving circuit DC that provides an electrical signal to each of the pixels PX through a signal line may be in the peripheral area PA. For example, the driving circuit DC may be a scan driving circuit that provides a scan signal to each of the pixels PX through a scan line SL. Alternatively, the driving circuit DC may be a data driving circuit that provides a data signal to each of the pixels PX through a data line DL. In an embodiment, the data driving circuit may be adjacent to one side of the display panel 10. For example, the data driving circuit in the peripheral area PA may correspond to a first side display area SDA1.

The peripheral area PA may include a pad portion, to which an electronic element, a printed circuit board, and/or the like may be connected (e.g., electrically connected). The pad portion may be exposed by not being covered by an insulating layer, and thus, may be connected (e.g., electrically connected) to a flexible printed circuit board (FPCB). The FPCB may connect (e.g., electrically connect) a controller to the pad portion and supply a signal or power transmitted from the controller. In some embodiments, the data driving circuit may be on the FPCB.

A first pixel PX1 including a display element may be in the front display area FDA. The front display area FDA may be a flat portion. In an embodiment, the front display area FDA may provide a major portion of an image.

The side display area SDA may include the pixels PX each including a display element, and may be bendable. In other words, as described above with reference to FIG. 1, the side display area SDA may be an area that bends from the front display area FDA. In an embodiment, the side display area SDA may gradually decrease in width in a direction away from the front display area FDA. In an embodiment, the side display area SDA may include the first side display area SDA1, a second side display area SDA2, a third side display area SDA3, and a fourth side display area SDA4.

The first side display area SDA1 and the third side display area SDA3 may be connected to each other in the first direction (e.g., the y direction or the −y direction). The first side display area SDA1 and the third side display area SDA3 may each extend in the first direction (e.g., the y direction or the −y direction) from the front display area FDA. In addition, the second side display area SDA2 and the fourth side display area SDA4 may be connected to each other in the second direction (e.g., the x direction or the −x direction). The second side display area SDA2 and the fourth side display area SDA4 may extend in the second direction (e.g., the x direction or the −x direction) from the front display area FDA.

The corner display area CDA may be between neighboring side display areas SDA (e.g., two adjacent side display areas selected from among the first side display area SDA1, the second side display area SDA2, the third side display area SDA3, and the fourth side display area SDA4). For example, the corner display area CDA may be between the first side display area SDA1 and the second side display area SDA2. Alternatively, the corner display area CDA may be between the second side display area SDA2 and the third side display area SDA3, or may be between the third side display area SDA3 and the fourth side display area SDA4, or may be between the fourth side display area SDA4 and the first side display area SDA1. Hereinafter, the corner display area CDA between the first side display area SDA1 and the second side display area SDA2 will be described in more detail.

The corner display area CDA may correspond to (e.g., be at) a corner portion CP of the display area DA. Here, the corner portion CP may be at a corner of the display area DA and may be a portion where a side (e.g., a long side) in the first direction (e.g., the y direction or the −y direction) and a side (e.g., a short side) in the second direction (e.g., the x direction or the −x direction) meet, cross, or intersect.

In addition, the corner display area CDA may at least partially surround the front display area FDA. For example, the corner display area CDA may be between the first side display area SDA1 and the second side display area SDA2 and may at least partially surround the front display area FDA.

A second pixel PX2 including a display element may be in the corner display area CDA, which may be bendable. In other words, as described above with reference to FIG. 1, the corner display area CDA may be an area that bends from the front display area FDA, and may correspond to (e.g., be at) the corner portion CP.

The intermediate display area MDA may be between the front display area FDA and the corner display area CDA. In addition, in an embodiment, the intermediate display area MDA may extend between the side display area SDA and the corner display area CDA. For example, the intermediate display area MDA may extend between the first side display area SDA1 and the corner display area CDA and/or between the second side display area SDA2 and the corner display area CDA. In an embodiment, the intermediate display area MDA may be bendable.

A third pixel PX3 including a display element may be in the intermediate display area MDA. In addition, in an embodiment, a driving circuit DC for providing an electrical signal or a power line for providing a voltage may be in the intermediate display area MDA. In an embodiment, the driving circuit DC may pass through the intermediate display area MDA and be arranged along the peripheral area PA. In this case, the third pixel PX3 in the intermediate display area MDA may overlap with the driving circuit DC or the power line. In another embodiment, the third pixel PX3 may not overlap with the driving circuit DC or the power line. In this case, the driving circuit DC may be arranged along the peripheral area PA.

At least one of the side display area SDA, the corner display area CDA, or the intermediate display area MDA may be bendable. In this case, the first side display area SDA1 of the side display area SDA may bend with a first curvature radius, and the second side display area SDA2 of the side display area SDA may bend with a second curvature radius. In this case, when the first curvature radius is greater than the second curvature radius, a curvature radius with which the corner display area CDA bends may gradually decrease in a direction from the first side display area SDA1 to the second side display area SDA2.

When the corner display area CDA bends, a compressive strain that is greater than a tensile strain may occur in the corner display area CDA. In this case, it is desirable to apply a shrinkable substrate and multilayer film structure to the corner display area CDA. Thus, a stacked structure of the multilayer film or a shape of the substrate 100 in the corner display area CDA may be different from a stacked structure of the multilayer film or a shape of the substrate 100 in the front display area FDA.

Figure 5:
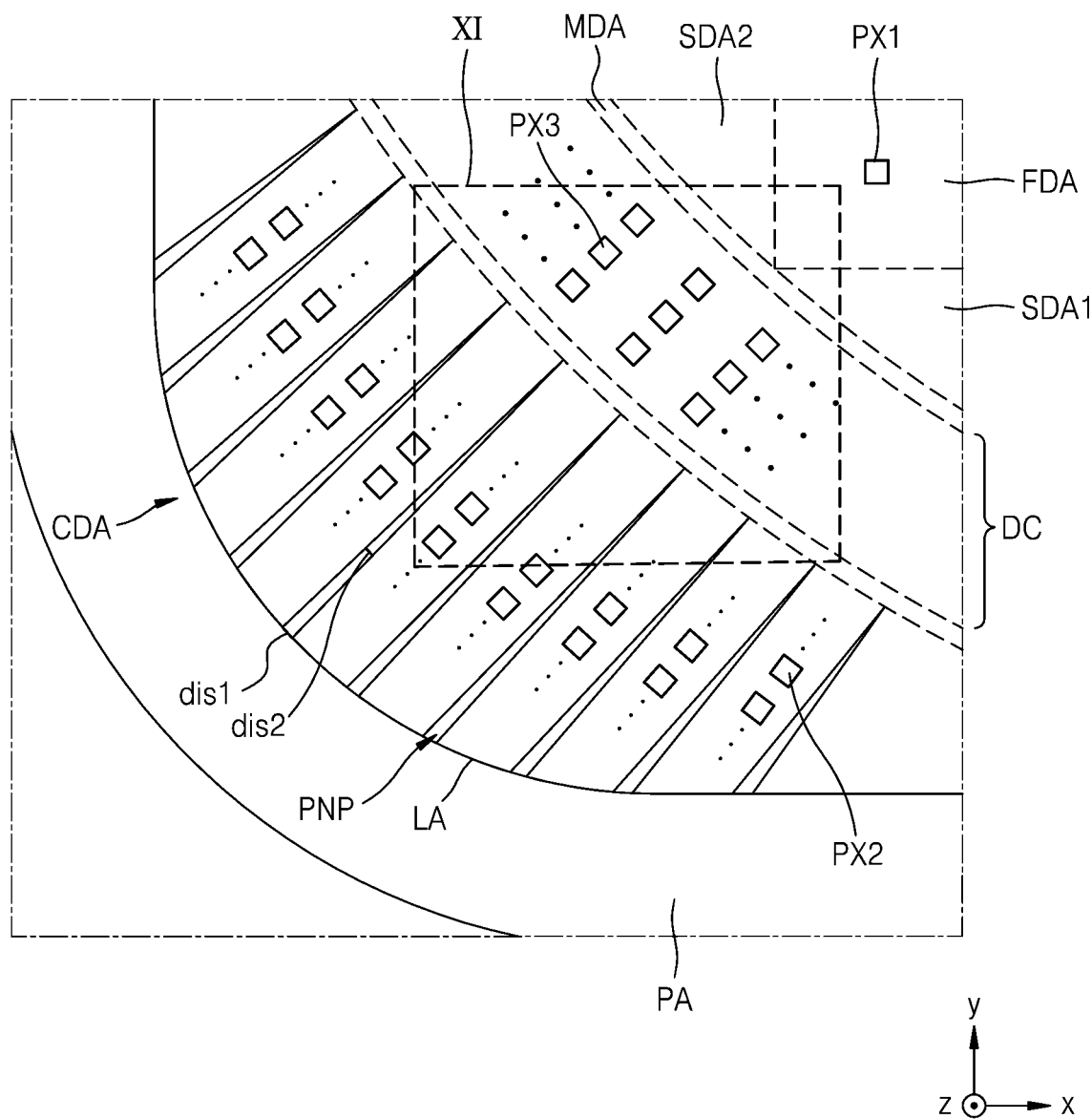
FIG. 5 is an enlarged view of a portion of a display panel according to an embodiment.

FIG. 5 is an enlarged view of a portion of a display panel according to an embodiment.

Referring to FIG. 5, the display panel may include a display area and a peripheral area PA. The display area may include a front display area FDA, a side display area (e.g., the side display areas SDA1 and/or SDA2), a corner display area CDA, and an intermediate display area MDA.

A first pixel PX1 may be in the front display area FDA, a second pixel PX2 may be in the corner display area CDA, and a third pixel PX3 may be in the intermediate display area MDA.

The corner display area CDA may include a plurality of extension areas LA, each of which extends from the intermediate display area MDA. In this case, each of the extension areas LA may extend in a direction away from the front display area FDA. The second pixels PX2 may be in each of the extension areas LA. In an embodiment, the second pixels PX2 may be arranged in (e.g., may be arranged with each other along) a line in a direction of extension of each of the extension areas LA. In another embodiment, the second pixels PX2 may be arranged (e.g., may be arranged with each other) along a plurality of lines in a direction of extension of each of the extension areas LA. Hereinafter, a case where the second pixels PX2 are arranged along a line in a direction in which each of the extension areas LA extends will be described in more detail.

A through portion PNP may be between a plurality of adjacent extension areas LA. Thus, an empty space may be defined between the adjacent extension areas LA.

In an embodiment, a width of the through portion PNP may gradually increase from the intermediate display area MDA toward ends of the extension areas LA. In other words, the width of the through portion PNP may increase in a direction away from the front display area FDA. In this case, the width of the through portion PNP indicates a distance between the adjacent extension areas LA. Thus, the extension areas LA may be radially arranged. For example, a first width dis1 of the through portion PNP at the ends of the extension areas LA may be greater than a second width dis2 of the through portion PNP at a middle point between the ends of the extension areas LA and the intermediate display area MDA.

In another embodiment, the width of the through portion PNP may be uniform or substantially uniform in the direction in which each of the extension areas LA extends, from the intermediate display area MDA. In this case, each of the extension areas LA may extend in the same direction from the intermediate display area MDA.

In an embodiment, each of the extension areas LA may be connected to the peripheral area PA. In this case, the extension areas LA may be fixed by the peripheral area PA. In some embodiments, the peripheral area PA may be spaced from (e.g., spaced apart from) each other to correspond to each of the extension areas LA. In this case, the through portion PNP may extend between the plurality of adjacent extension areas LA to the peripheral area PA.

Figure 6A:
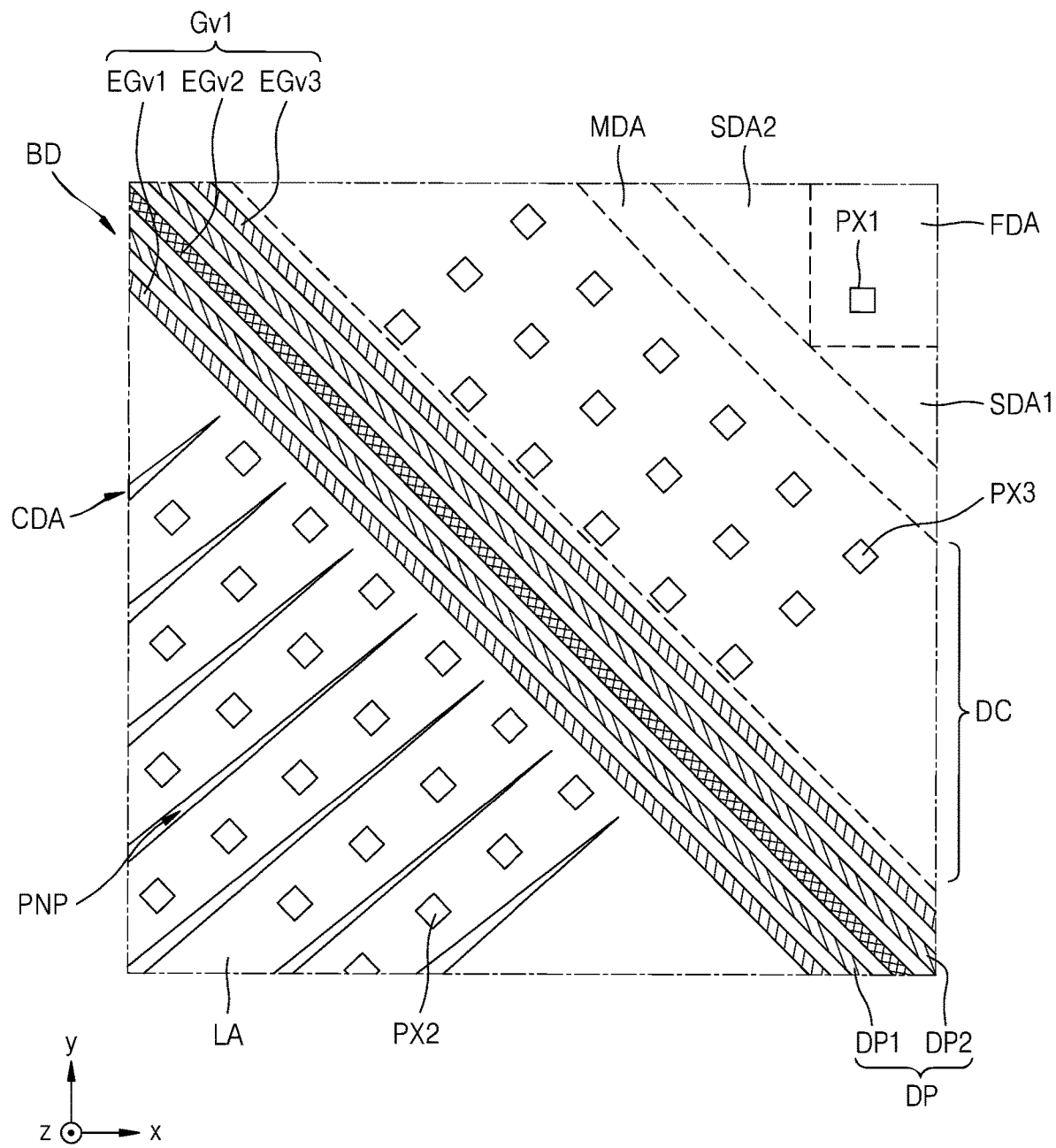
FIGS. 6A and 6B are enlarged views of a portion of a display panel according to an embodiment.
Figure 6B:
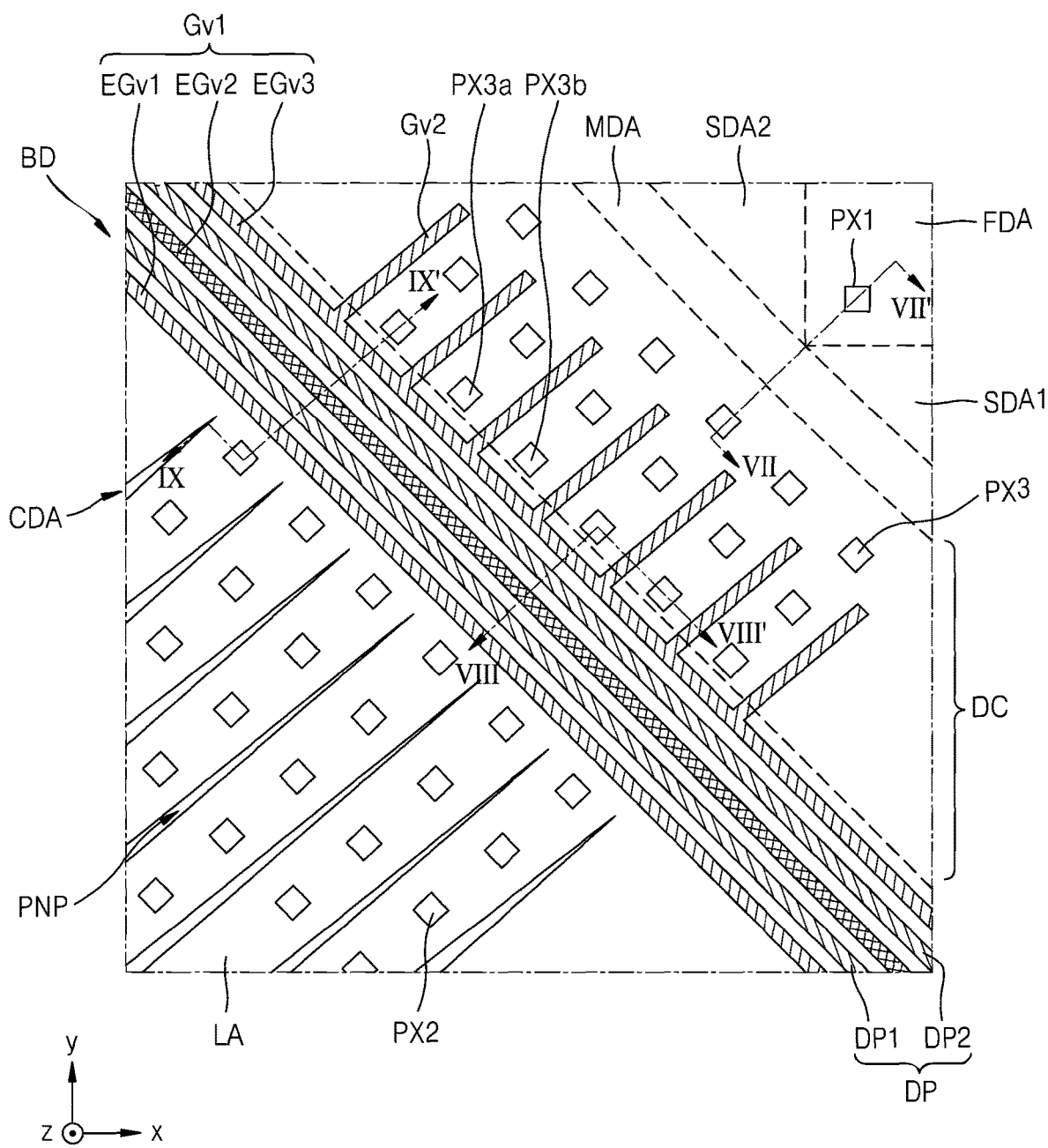

FIGS. 6A and 6B are enlarged views of a portion of a display panel according to an embodiment. FIGS. 6A and 6B are enlarged views of region XI of FIG. 5 according to an embodiment. In FIGS. 6A and 6B, the same members as those of FIG. 5 are denoted by the same reference numerals, and thus, a redundant explanation may not be repeated.

Referring to FIGS. 6A and 6B, the display panel may include a display area and a peripheral area, and the display area may include the front display area FDA, the side display area (e.g., the side display areas SDA1 and/or SDA2), the corner display area CDA, and the intermediate display area MDA.

The first pixel PX1 may be in the front display area FDA, the second pixel PX2 may be in the corner display area CDA, and the third pixel PX3 may be in the intermediate display area MDA.

A plurality of third pixels PX3 may be arranged side by side with the second pixel PX2 of the corner display area CDA. In an embodiment, when the second pixels PX2 are arranged along one line in a direction in which each of the extension areas LA extends, the third pixels PX3 may also be arranged along that line.

The third pixels PX3 may overlap with a driving circuit DC. For example, an intermediate display element of the third pixel PX3 may overlap with the driving circuit DC. The intermediate display element may include a display element overlapping with the driving circuit DC. For example, the intermediate display element may include an organic light-emitting diode overlapping with the driving circuit DC. The driving circuit DC may supply an electrical signal to the pixel circuit PC (e.g., see FIG. 3) through a signal line. For example, the driving circuit DC may be connected to the scan line SL (e.g., see FIG. 3), and supply a scan signal to the pixel circuit PC (e.g., see FIG. 3). The driving circuit DC may include at least one thin-film transistor.

The pixel circuit PC (e.g., see FIG. 3) of the intermediate display element may be spaced from (e.g., spaced apart from) the intermediate display area MDA. For example, the pixel circuit PC (e.g., see FIG. 3) of the intermediate display element may be in the front display area FDA, and the pixel circuit PC (e.g., see FIG. 3) of the intermediate display element may be connected to the intermediate display element by a connection line extending from the front display area FDA to the intermediate display area MDA. As another example, the pixel circuit PC (e.g., see FIG. 3) of the intermediate display element may be in the corner display area CDA, and the pixel circuit PC (e.g., see FIG. 3) of the intermediate display element may be connected to the intermediate display element by a connection line extending from the corner display area CDA to the intermediate display area MDA.

The display panel may include a dam portion DP on a substrate. The dam portion DP may protrude in a thickness direction of the substrate. The dam portion DP may extend between the second pixel PX2 and the third pixel PX3. The dam portion DP may extend such that a boundary BD between the intermediate display area MDA and the corner display area CDA is defined by the dam portion DP. The dam portion DP may include a first dam portion DP1 and a second dam portion DP2. In an embodiment, the first dam portion DP1 and the second dam portion DP2 may extend side by side. For example, adjacent portions of the first dam portion DP1 and the second dam portion DP2 may be parallel or substantially parallel to each other.

When the second pixel PX2 and the third pixel PX3 employ an organic light-emitting diode as a display element, the organic light-emitting diode may be vulnerable to oxygen and moisture. Thus, a thin-film encapsulation layer for encapsulating the organic light-emitting diode may be on each of the second pixel PX2 and the third pixel PX3. In this case, the thin-film encapsulation layer may include at least one inorganic encapsulation layer and at least one organic encapsulation layer.

Because the dam portion DP protrudes in the thickness direction of the substrate, when the at least one organic encapsulation layer is formed, the dam portion DP may control the flow of an organic material forming the at least one organic encapsulation layer. In this case, the at least one organic encapsulation layer may be separated based on the dam portion DP.

The display panel may include a groove concave in the thickness direction of the substrate. Referring to FIGS. 6A and 6B, the display panel may include a first groove Gv1 on the substrate. The first groove Gv1 may be concave in the thickness direction of the substrate.

The first groove Gv1 may extend between the second pixel PX2 and the third pixel PX3. In one or more embodiments, the first groove Gv1 may extend in parallel with the dam portion DP (e.g., the first dam portion DP1 and/or the second dam portion DP2). In an embodiment, the first groove Gv1 may include a first extension groove EGv1, a second extension groove EGv2, and a third extension groove EGv3. In another embodiment, the first groove Gv1 may include a fourth extension groove or may include more than four extension grooves.

In an embodiment, the display panel may further include an inorganic pattern layer having a pair of protruding tips arranged on or at both sides (e.g., opposite sides) of the first groove Gv1 and protruding in a center direction of the first groove Gv1. Each of the pair of protruding tips may be arranged on or at respective sides (e.g., opposite sides) of the first groove Gv1. In an embodiment, each of the pair of protruding tips may overlap the first groove GV1 in a plan view.

The first extension groove EGv1 may be between the second pixel PX2 and the first dam portion DP1. In one or more embodiments, the first extension groove EGv1 may extend along the plurality of extension areas LA. In this case, the second pixel PX2 may be at least partially surrounded by the first extension groove EGv1. In an embodiment, the second pixel PX2 may be entirely surrounded by the first extension groove EGv1.

The second extension groove EGv2 may be between the first dam portion DP1 and the second dam portion DP2. The second extension groove EGv2 may extend in parallel with the first dam portion DP1 and the second dam portion DP2.

The third extension groove EGv3 may be between the second dam portion DP2 and the third pixel PX3. In this case, the third extension groove EGv3 may extend in the same direction as the second dam portion DP2.

The at least one organic encapsulation layer may fill the third extension groove EGv3. Thus, the organic light-emitting diode adjacent to the dam portion DP may be sealed with at least one inorganic encapsulation layer and at least one organic encapsulation layer, and a distance between the dam portion DP and the third pixel PX3 may be reduced.

Referring to FIG. 6B, the display panel may include a second groove Gv2 on the substrate. The second groove Gv2 may be concave in the thickness direction of the substrate. The second groove Gv2 may extend between neighboring third pixels PX3. The second groove Gv2 may be concave in the thickness direction of the substrate, similar to the first groove Gv1. In an embodiment, the second groove Gv2 may be connected to the third extension groove EGv3. In this case, the second groove Gv2 may be provided integrally with the third extension groove EGv3. In one or more embodiments, the second groove Gv2 may be at one side of the third extension groove EGv3.

At least one third pixel PX3 may be in the intermediate display area. In an embodiment, the at least one third pixel PX3 may include a first intermediate pixel PX3a and a second intermediate pixel PX3b each facing the corner display area CDA. In an embodiment, the third pixel PX3 may include the first intermediate pixel PX3a and the second intermediate pixel PX3b each facing the extension areas LA. The first intermediate pixel PX3a may include a first intermediate display element, and the second intermediate pixel PX3b may include a second intermediate display element. The second groove Gv2 may extend between the first intermediate pixel PX3a and the second intermediate pixel PX3b.

By providing the second groove Gv2 in the intermediate display area MDA, a width of the third extension groove EGv3 may be reduced. In this case, the width of the third extension groove EGv3 may be a length of the third extension groove EGv3 in a direction perpendicular to an extension direction of the third extension groove EGv3. For example, the at least one organic encapsulation layer may fill each of the third extension groove EGv3 and the second groove Gv2. In the present embodiment, an area between the neighboring third pixels PX3 may be used to control an organic material forming the at least one organic encapsulation layer. Thus, the width of the third extension groove EGv3 controlling the flow of the organic material forming the at least one organic encapsulation layer may be reduced.

Thus, an area occupied by the dam portion DP and the first groove Gv1 may decrease, and by using the unoccupied area, more pixels PX may be arranged in the same area (e.g., area shared by the dam portion DP and the pixels PX). That is, a resolution of the intermediate display area MDA may increase. In addition, the user may not be able to identify the boundary BD between the intermediate display area MDA and the corner display area CDA.

The second groove Gv2 may extend in a direction crossing each of the first direction (e.g., y direction or −y direction) and the second direction (e.g., x direction or −x direction) between the neighboring third pixels PX3. In an embodiment, the second groove Gv2 may extend in an extension direction of the plurality of extension areas LA in the intermediate display area MDA.

In this case, the organic material forming the at least one organic encapsulation layer may flow along the second groove Gv2. Thus, the second groove Gv2 may precisely control the flow of organic material forming the at least one organic encapsulation layer. In addition, the second groove Gv2 may control the at least one organic encapsulation layer formed in the intermediate display area MDA to extend to the second dam portion DP2. Hereinafter, a detailed description where the display panel includes the second groove Gv2 as shown in FIG. 6B will be given.

Figure 7:
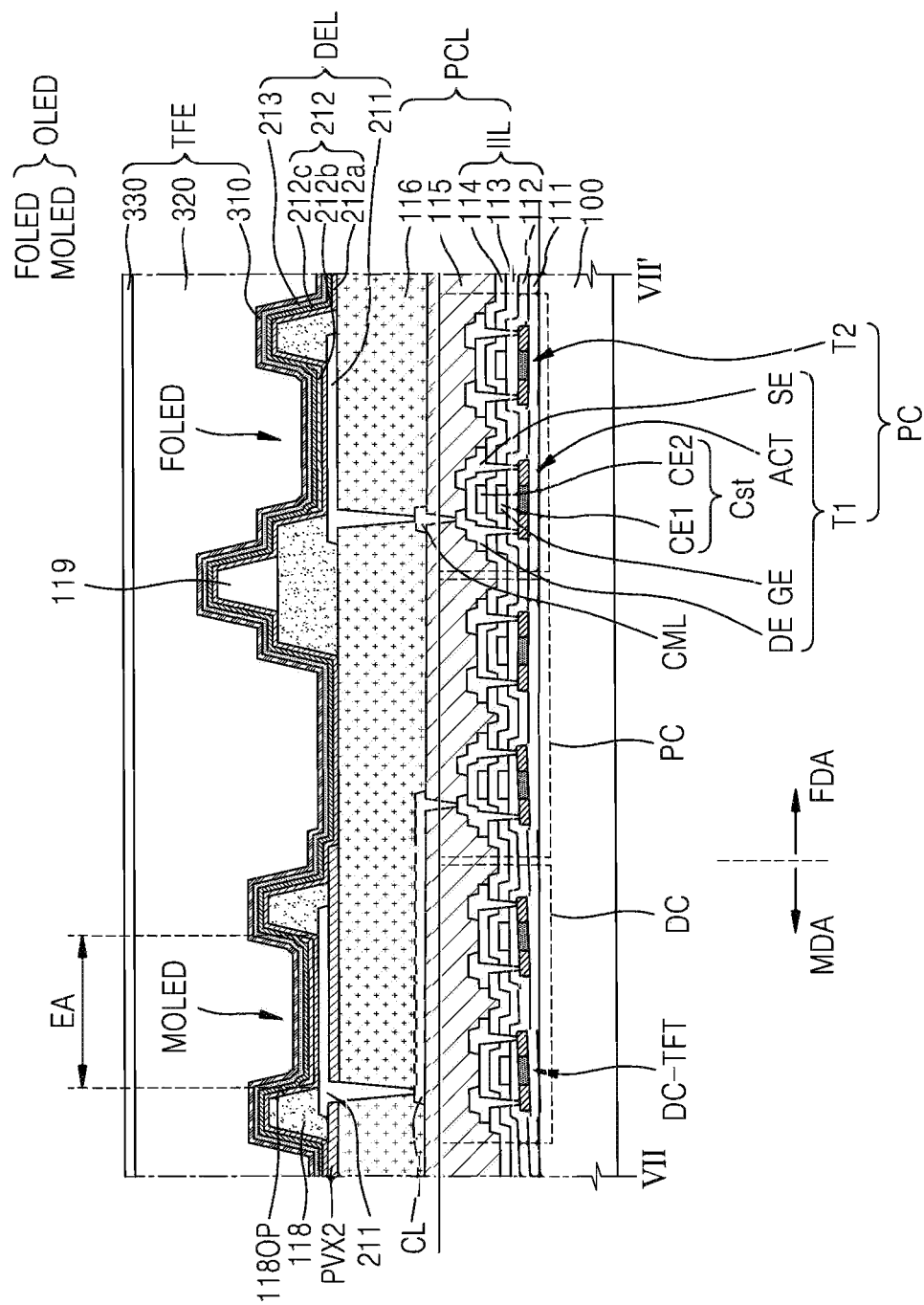
FIG. 7 is a schematic cross-sectional view of the display panel of FIG. 6B taken along the line VII-VII' according to an embodiment.

FIG. 7 is a schematic cross-sectional view of the display panel of FIG. 6B taken along the line VII-VII' according to an embodiment.

Referring to FIG. 7, the display panel may include a substrate 100, a buffer layer 111, a pixel circuit layer PCL, an inorganic pattern layer PVX2, a display element layer DEL, and a thin-film encapsulation layer TFE.

The buffer layer 111 may be on the substrate 100. The buffer layer 111 may include inorganic insulating materials such as silicon nitride ($SiN_x$), silicon oxynitride ($SiO_xN_y$), and silicon oxide ($SiO_x$), and may be a single layer or multiple layers including the aforementioned inorganic insulating material.

The pixel circuit layer PCL may be on the buffer layer 111. The pixel circuit layer PCL may include a driving circuit DC and a pixel circuit PC. In an embodiment, the driving circuit DC may be in the intermediate display area MDA. The pixel circuit PC may be in the front display area FDA. In an embodiment, the pixel circuit PC may be spaced from (e.g., spaced apart from) the intermediate display area MDA.

The driving circuit DC may include a driving circuit thin-film transistor DC-TFT. In an embodiment, the driving circuit DC may be connected to a scan line. The pixel circuit PC may include a driving thin-film transistor T1, a switching thin-film transistor T2, and a storage capacitor Cst.

The pixel circuit layer PCL may include an inorganic insulating layer IIL, a first insulating layer 115, and a second insulating layer 116 that are arranged below and/or above components of the driving thin-film transistor T1. The inorganic insulating layer IIL may include a first gate insulating layer 112, a second gate insulating layer 113, and an interlayer insulating layer 114.

The driving thin-film transistor T1 may include a semiconductor layer ACT, a gate electrode GE, a source electrode SE, and a drain electrode DE.

The semiconductor layer Act may include polysilicon. Alternatively, the semiconductor layer ACT may include amorphous silicon, an oxide semiconductor, or an organic semiconductor. The semiconductor layer ACT may include a channel area, a drain area, and a source area, wherein the drain area and the source area are at respective sides of the channel area. The gate electrode GE may overlap with the channel area.

The gate electrode GE may include a low-resistance metal material. The gate electrode GE may include a conductive material including molybdenum (Mo), aluminum (Al), copper (Cu), titanium (Ti), and/or the like, and may be formed of a single layer or multiple layers including the above materials.

The first gate insulating layer 112 between the semiconductor layer ACT and the gate electrode GE may include an inorganic insulating material such as $SiO_x$, $SiN_x$, $SiO_xN_y$, aluminum oxide ($Al_2O_3$), titanium oxide ($TiO_2$), tantalum oxide ($Ta_2O_5$), hafnium oxide ($HfO_2$), zinc oxide (ZnO), and/or the like.

The second gate insulating layer 113 may cover the gate electrode GE. Similar to the second gate insulating layer 113, the first gate insulating layer 112 may include an inorganic insulating material such as $SiO_x$, $SiN_x$, $SiO_xN_y$, $Al_2O_3$, $TiO_2$, $Ta_2O_5$, $HfO_2$, and/or ZnO.

An upper electrode CE2 of the storage capacitor Cst may be on the second gate insulating layer 113. The upper electrode CE2 may overlap with the gate electrode GE therebelow. In one or more embodiments, the gate electrode GE and the upper electrode CE2 of the driving thin-film transistor T1 overlapping with each other with the second gate insulating layer 113 therebetween may form the storage capacitor Cst. In other words, the gate electrode GE may function as a lower electrode CE1 of the storage capacitor Cst.

As described above, the storage capacitor Cst and the driving thin-film transistor T1 may overlap with each other. In some embodiments, the storage capacitor Cst may not overlap with the driving thin-film transistor T1.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may include a single layer or multiple layers of the aforementioned materials.

The interlayer insulating layer 114 may cover the upper electrode CE2. The interlayer insulating layer 114 may include $SiO_x$, $SiN_x$, $SiO_xN_y$, $Al_2O_3$, $TiO_2$, $Ta_2O_5$, $HfO_2$, ZnO, and/or the like. The interlayer insulating layer 114 may include a single layer or multiple layers including the aforementioned inorganic insulating materials.

Each of the drain electrode DE and the source electrode SE may be on the interlayer insulating layer 114. The drain electrode DE and the source electrode SE may each include materials with good conductivity. Each of the drain electrode DE and the source electrode SE may include a conductive material including Mo, Al, Cu, Ti, and/or the like, and may have a single layer or multilayer structure including the above-mentioned material. In an embodiment, each of the drain electrode DE and the source electrode SE may have a multilayer structure of Ti layer/Al layer/Ti layer.

Similar to the driving thin-film transistor T1, the switching thin-film transistor T2 and the driving circuit thin-film transistor DC-TFT may each include a semiconductor layer, a gate electrode, a source electrode, and a drain electrode.

The first insulating layer 115 may cover each of the drain electrode DE and the source electrode SE. The first insulating layer 115 may include an organic material. For example, the first insulating layer 115 may include an organic insulating material such as general-purpose polymer such as poly(methyl methacrylate) (PMMA) or polystyrene (PS), polymer derivative having a phenol-based group, acryl-based polymer, imide-based polymer, aryl ether-based polymer, amide-based polymer, fluorine-based polymer, p-xylene-based polymer, vinyl alcohol-based polymer, and/or a blend thereof.

Each of a connection electrode CML and a connection line CL may be on the first insulating layer 115. In this case, the connection electrode CML and the connection line CL may be respectively connected to the drain electrode DE and the source electrode SE via contact holes in the first insulating layer 115. The connection electrode CML and connection line CL may each include conductive materials (e.g., materials with good conductivity). Each of the connection electrode CM and the connection line CL may include a conductive material including Mo, Al, Cu, Ti, and/or the like and may include a single layer or multiple layers including the above-mentioned materials. In an embodiment, the connection electrode CML may have a multilayer structure of Ti layer/Al layer/Ti layer.

The connection line CL may extend from the front display area FDA to the intermediate display area MDA. In this case, the connection line CL may overlap with the driving circuit thin-film transistor DC-TFT.

The second insulating layer 116 may cover each of the connection electrode CML and the connection line CL. The second insulating layer 116 may include an organic insulating layer. The second insulating layer 116 may include an organic insulating material including a general purpose polymer (such as poly(methyl methacrylate) (PMMA) and/or polystyrene (PS)), a polymer derivative having a phenolic group, an acrylic polymer, an imide polymer, an aryl ether polymer, an amide polymer, a fluorine polymer, a p-xylene-based polymer, a vinyl alcohol-based polymer, and/or a blend thereof.

The inorganic pattern layer PVX2 may be on the second insulating layer 116. For example, the inorganic pattern layer PVX2 may overlap with the intermediate display area MDA. The inorganic pattern layer PVX2 may be a single layer or multiple layers including an inorganic material such as $SiN_x$, $SiO_x$, and/or the like. In some embodiments, the inorganic pattern layer PVX2 may be omitted.

The display element layer DEL may be on the pixel circuit layer PCL. The display element layer DEL may include an organic light-emitting diode OLED. For example, the display element layer DEL may include a front organic light-emitting diode FOLED and an intermediate organic light-emitting diode MOLED, wherein the front organic light-emitting diode FOLED is in the front display area FDA, and the intermediate organic light-emitting diode MOLED is in the intermediate display area MDA. In this case, the intermediate organic light-emitting diode MOLED may be on the inorganic pattern layer PVX2 and overlap with the driving circuit DC. Therefore, in the present embodiment, an image may be displayed even in the intermediate display area MDA where the driving circuit DC is arranged.

A pixel electrode 211 of a front organic light-emitting diode FOLED may be connected (e.g., electrically connected) to the connection electrode CML via a contact hole in the second insulating layer 116. The pixel electrode 211 of the intermediate organic light-emitting diode MOLED may be connected to the connection line CL via a contact hole in the second insulating layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 211 may include a reflective film including silver (Ag), magnesium (Mg), Al, platinum (Pt), palladium (Pd), gold (Au), nickel (Ni), neodymium (Nd), iridium (Ir), chromium (Cr), and/or a compound thereof. In another embodiment, the pixel electrode 211 may further include a layer including ITO, IZO, ZnO, and/or $In_2O_3$ above or below the aforementioned reflective layer.

A pixel-defining layer 118 including an opening 118OP through which a central portion of the pixel electrode 211 is exposed may be on the pixel electrode 211. The pixel-defining layer 118 may include an organic insulating material and/or an inorganic insulating material. The opening 118OP may define a light-emitting area EA (hereinafter referred to as "emission area EA") of light emitted from the organic light-emitting diode OLED. For example, a width of the opening 118OP may correspond to a width of the emission area EA.

A spacer 119 may be on the pixel-defining layer 118. In a method of manufacturing a display device, the spacer 119 may be for preventing or reducing damage to the substrate 100 and/or a multilayer film on the substrate 100. In a method of manufacturing a display panel, a mask sheet may be used, and in this case, the mask sheet may enter the opening 118OP of the pixel-defining layer 118 or may adhere to the pixel-defining layer 118. When depositing a deposition material on the substrate 100, the spacer 119 may prevent or substantially prevent defects in which a portion of the substrate 100 and the multilayer film is damaged or destroyed by the mask sheet.

The spacer 119 may include an organic material such as polyimide. Alternatively, the spacer 119 may include an inorganic insulating material such as $SiN_x$ and/or $SiO_x$, or may include both an organic insulating material and an inorganic insulating material.

In an embodiment, the spacer 119 may include a material different from a material of the pixel-defining layer 118. Alternatively, in another embodiment, the spacer 119 may include the same material as the pixel-defining layer 118, and in this case, the pixel-defining layer 118 and the spacer 119 may be formed together in a mask process using a halftone mask or the like.

An intermediate layer 212 may be on the pixel-defining layer 118. The intermediate layer 212 may include an emission layer 212b in the opening 118OP of the pixel-defining layer 118. The emission layer 212b may include a polymer organic material or low molecular weight organic material emitting light having a certain color.

A first functional layer 212a and a second functional layer 212c may be positioned below and above the emission layer 212b, respectively. For example, the first functional layer 212a may include a hole transport layer (HTL) or may include an HTL and a hole injection layer (HIL). The second functional layer 212c is an element on the emission layer 212b and may be optional. The second functional layer 212c may include an electron transport layer (ETL) and/or an electron injection layer (EIL). Like an opposite electrode 213 to be described in more detail below, the first functional layer 212a and/or the second functional layer 212c may be common layers formed to entirely cover the substrate 100.

The opposite electrode 213 may include a conductive material having a low work function. For example, the opposite electrode 213 may include a (semi-)transparent layer including Ag, Mg, Al, Pt, Pd, Au, Ni, Nd, Ir, Cr, Li, Ca, and/or an alloy thereof. Alternatively, the opposite electrode 213 may further include a layer such as an ITO layer, an IZO layer, a ZnO layer, and/or an $In_2O_3$ layer, on the (semi-)transparent layer including the aforementioned materials.

In some embodiments, a capping layer may be further on the opposite electrode 213. The capping layer may include lithium fluoride (LiF), an inorganic material, and/or an organic material.

The thin-film encapsulation layer TFE may be on the opposite electrode 213. In an embodiment, the thin-film encapsulation layer TFE may include at least one inorganic encapsulation layer and at least one organic encapsulation layer. In an embodiment, FIG. 7 shows that the thin-film encapsulation layer TFE includes a first inorganic encapsulation layer 310, an organic encapsulation layer 320, and a second inorganic encapsulation layer 330, which are stacked (e.g., sequentially stacked).

Each of the first inorganic encapsulation layer 310 and the second inorganic encapsulation layer 330 may include one or more inorganic materials selected from among aluminum oxide, titanium oxide, tantalum oxide, hafnium oxide, zinc oxide, silicone oxide, silicone nitride, and silicone oxynitride. The organic encapsulation layer 320 may include a polymer-based material. The polymer-based material may include acrylic resin, epoxy resin, polyimide, polyethylene, and/or the like. In an embodiment, the organic encapsulation layer 320 may include acrylate.

In one or more embodiments, a touch electrode layer may be on the thin-film encapsulation layer TFE, and an optical functional layer may be on the touch electrode layer. The touch electrode layer may obtain coordinate information according to an external input, for example, a touch event. The optical functional layer may reduce reflectance of light (external light) incident from the outside toward the display device and/or may improve color purity of light emitted from the display device. In an embodiment, the optical functional layer may include a retarder and/or a polarizer. The retarder may be of a film type (e.g., a film) or a liquid crystal coating type (e.g., a liquid crystal coating) and may include a λ/2 retarder and/or a λ/4 retarder. The polarizer may be of a film type or a liquid crystal coating type as well. Those of the film type may include a stretchable synthetic resin film, and those of the liquid crystal coating type may include liquid crystals arranged in a certain array. Each of the retarder and the polarizer may further include a protective film.

In another embodiment, the optical functional layer may include a black matrix and color filters. The color filters may be arranged considering a color of light emitted from each of the pixels of the display device. Each of the color filters may include red, green, or blue pigment or dye. Alternatively, each of the color filters may further include quantum dots in addition to the aforementioned pigment or dye. Alternatively, some of the color filters may not include the aforementioned pigment or dye but may include scattering particles such as titanium oxide.

In another embodiment, the optical functional layer may include a destructive interference structure. The destructive interference structure may include a first reflective layer and a second reflective layer, which are located on different layers. First reflected light and second reflected light respectively reflected from the first reflective layer and the second reflective layer may destructively interfere with each other, and thus, the reflectance of external light may be reduced.

An adhesive element may be between the touch electrode layer and the optical functional layer. Any suitable adhesive element (e.g., general adhesive elements) may be used as the adhesive element between the touch electrode layer and the optical functional layer. The adhesive element may include a pressure sensitive adhesive (PSA).

Figure 8A:
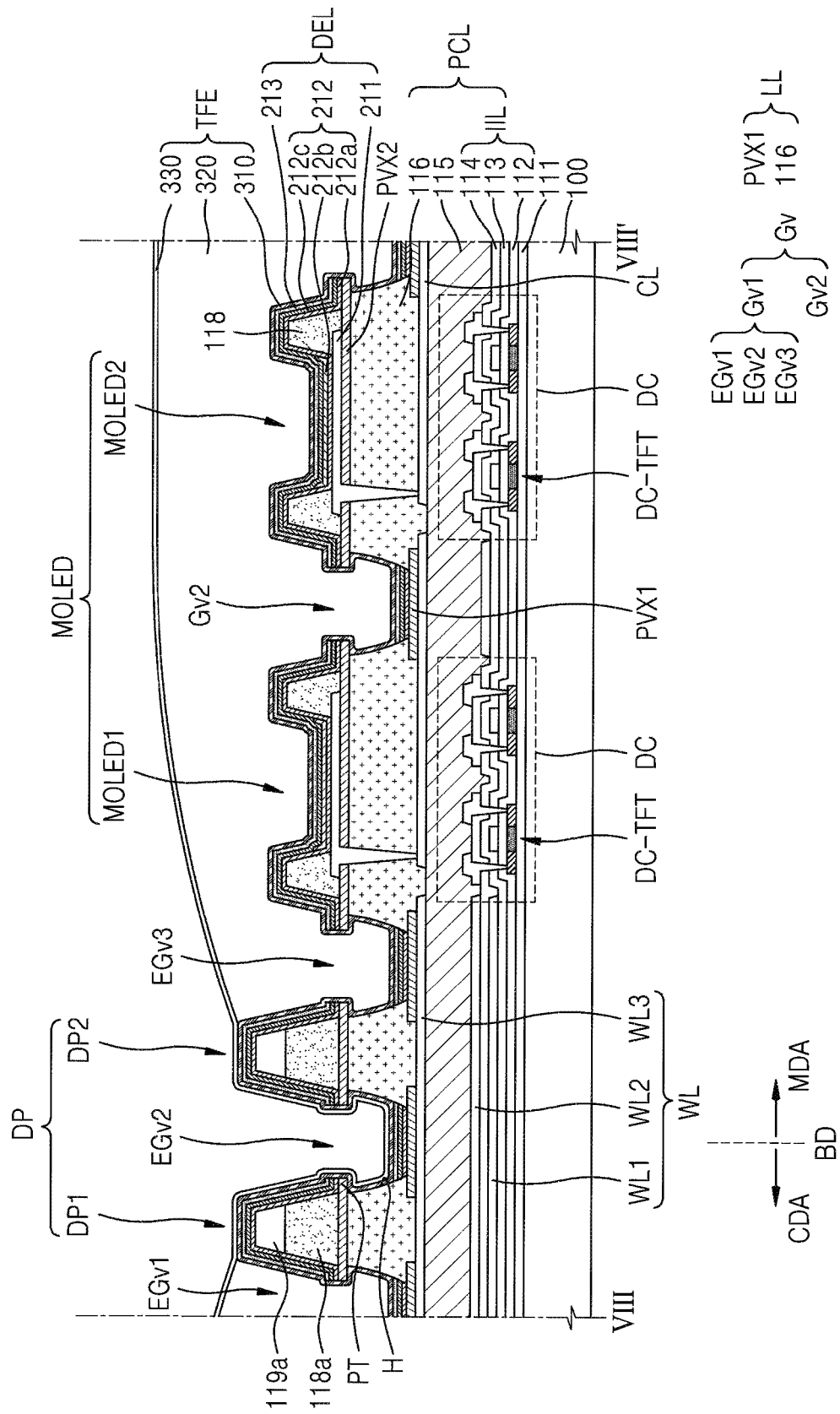
FIGS. 8A and 8B are schematic cross-sectional views of the display panel of FIG. 6B taken along the line VIII-VIII' according to an embodiment.
Figure 8B:
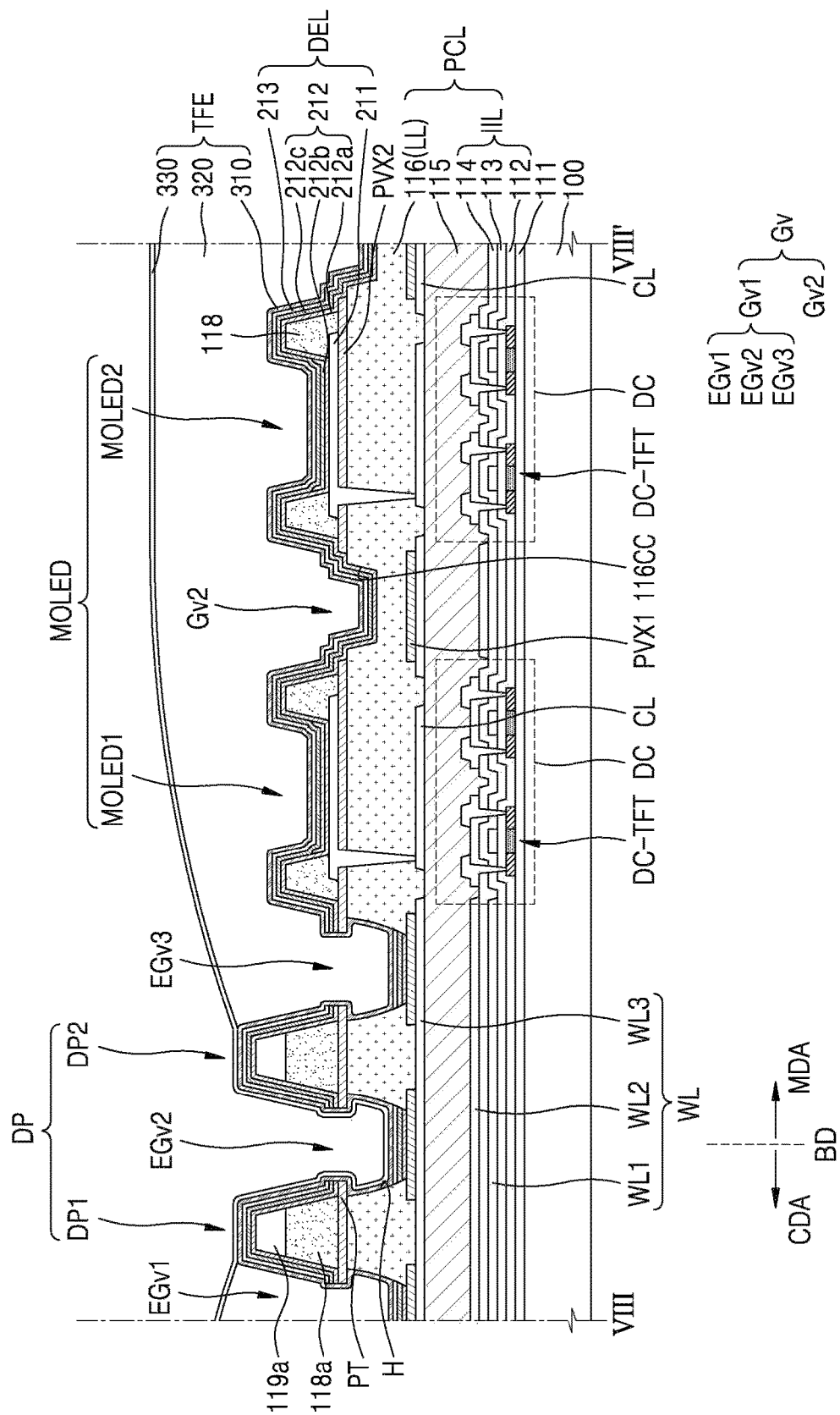

FIGS. 8A and 8B are schematic cross-sectional views of the display panel of FIG. 6B taken along the line VIII-VIII' according to an embodiment. In FIGS. 8A and 8B, the same members as those of FIG. 7 are denoted by the same reference numerals, and thus, a redundant explanation may not be repeated.

Referring to FIGS. 8A and 8B, the display panel may include the substrate 100, the buffer layer 111, the pixel circuit layer PCL, a dam portion DP, the inorganic pattern layer PVX2, the display element layer DEL, and the thin-film encapsulation layer TFE. The substrate 100 may include a corner display area CDA and the intermediate display area MDA, and the pixel circuit layer PCL may include the inorganic insulating layer IIL, the first insulating layer 115, the second insulating layer 116, a line WL, and the driving circuit DC. The display element layer DEL may include the intermediate organic light-emitting diode MOLED as an intermediate display element.

The line WL may extend from the intermediate display area MDA to the corner display area CDA. The line WL may transmit an electrical signal or provide a voltage to a pixel circuit in the corner display area CDA. In an embodiment, the line WL may include a first line WL1, a second line WL2, and a third line WL3. The second line WL2 may be between the first line WL1 and the third line WL3.

In an embodiment, the first line WL1 may be between the first gate insulating layer 112 and the second gate insulating layer 113. In another embodiment, the first line WL1 may be between the second gate insulating layer 113 and the interlayer insulating layer 114 (e.g., as shown in the embodiments of FIGS. 8A and 8B). In another embodiment, the first line WL1 may be between the buffer layer 111 and the first gate insulating layer 112.

The second line WL2 may be between the interlayer insulating layer 114 and the first insulating layer 115. The third line WL3 may be between the first insulating layer 115 and the second insulating layer 116.

A lower layer LL may be between the substrate 100 and the pixel electrode 211. For example, the lower layer LL may be on the third line WL3, the connection line CL, and the first insulating layer 115, and the inorganic pattern layer PVX2 and the pixel electrode 211 may be on the lower layer LL. The lower layer LL may include a groove Gv concave in the thickness direction of the substrate 100.

Referring to FIG. 8A, the lower layer LL may include a lower inorganic pattern layer PVX1 and the second insulating layer 116. The lower inorganic pattern layer PVX1 may be on the third line WL3 and/or the connection line CL. In an embodiment, a plurality of lower inorganic pattern layers PVX1 may be on the third line WL3 and/or connection line CL, and the lower inorganic pattern layers PVX1 may be spaced from (e.g., spaced apart from) each other on the third line WL3 and/or the connection line CL. The lower inorganic pattern layer PVX1 may be a single layer or multiple layers including an inorganic material such as $SiN_x$, $SiO_x$, and/or the like.

The second insulating layer 116 may be on each of the lower inorganic pattern layer PVX1, the third line WL3, and the connection line CL. The second insulating layer 116 may include a hole H through which the lower inorganic pattern layer PVX1 is exposed, and the second insulating layer 116 may cover an edge of the lower inorganic pattern layer PVX1. In this case, the lower inorganic pattern layer PVX1 and the hole H of the second insulating layer 116 may define the groove Gv.

The hole H of the second insulating layer 116 may be formed by an etching process. In an embodiment, the hole H of the second insulating layer 116 may be formed by etching the second insulating layer 116 between the adjacent inorganic pattern layers PVX2. For example, after the inorganic pattern layer PVX2, the pixel electrode 211, and the dam portion DP are formed, a protective pattern layer may be formed on the inorganic pattern layer PVX2, the pixel electrode 211, and the dam portion DP. A plurality of protective pattern layers may be provided. The second insulating layer 116 may be exposed between the plurality of protective pattern layers that are adjacent to each other. The protective pattern layer may include indium zinc oxide (IZO). Then, the hole H of the second insulating layer 116 may be formed by dry-etching the second insulating layer 116. Then, the protective pattern layer may be removed by wet etching. In an embodiment, a process of forming the hole H in the second insulating layer 116 may be performed together with a process of forming the through portion PNP by etching the substrate 100 described above with reference to FIG. 5.

When the lower inorganic pattern layer PVX1 is omitted, the third line WL3 and/or the connection line CL may be etched by the above-described etching process. In this case, a resistance of the third line WL3 and/or the connection line CL may increase. Therefore, the lower inorganic pattern layer PVX1 may be arranged on the third line WL3 and/or the connection line CL to correspond to the hole H of the second insulating layer 116. Accordingly, the third line WL3 and/or the connection line CL may be covered by the second insulating layer 116 and the lower inorganic pattern layer PVX1, thus preventing or substantially preventing the third line WL3 and/or the connection line CL from being etched by the etching process.

In an embodiment, the groove Gv may include the first groove Gv1 and the second groove Gv2. The first groove Gv1 may extend in parallel with the dam portion DP. In an embodiment, the dam portion DP may include a first dam portion DP1 and a second dam portion DP2. The first groove Gv1 may include a first extension groove EGv1, a second extension groove EGv2, and a third extension groove EGv3. In an embodiment, the first dam portion DP1 may be between the first extension groove EGv1 and the second extension groove EGv2, and the second dam portion DP2 may be between the second extension groove EGv2 and the third extension groove EGv3.

The second groove Gv2 may extend in a direction crossing a direction in which the dam portion DP extends (e.g., in a plan view). In the present embodiment, the second groove Gv2 may be between intermediate organic light-emitting diodes MOLED adjacent to each other. In an embodiment, the intermediate organic light-emitting diode MOLED may include a first intermediate organic light-emitting diode MOLED1 and a second intermediate organic light-emitting diode MOLED2 each facing the corner display area CDA. In one or more embodiments, the second groove Gv2 may extend between the first intermediate organic light-emitting diode MOLED1 and the second intermediate organic light-emitting diode MOLED2.

The inorganic pattern layer PVX2 may be on the second insulating layer 116 and may be at opposite sides of the groove Gv. In addition, the inorganic pattern layer PVX2 may include a pair of protruding tips PT protruding toward the center of the groove Gv.

The intermediate organic light-emitting diode MOLED may be on the lower layer LL. The intermediate organic light-emitting diode MOLED may include the pixel electrode 211, the intermediate layer 212 including the emission layer 212b, and the opposite electrode 213. In addition, the intermediate layer 212 may include the first functional layer 212a between the pixel electrode 211 and the emission layer 212b and/or may include the second functional layer 212c between the emission layer 212b and the opposite electrode 213. In this case, each of the first functional layer 212a and the second functional layer 212c may be formed on the entire surfaces of the intermediate display area MDA and the corner display area CDA. The first functional layer 212a and the second functional layer 212c may include organic materials, and external oxygen, moisture, and/or the like may be introduced into the intermediate display area MDA and the corner display area CDA through the first functional layer 212a and the second functional layer 212c. If introduced, the organic light-emitting diodes in the intermediate display area MDA and/or the corner display area CDA may be damaged by such oxygen or moisture. In the present embodiment, each of the first functional layer 212a and the second functional layer 212c may be disconnected by the groove Gv and the protruding tips PT, and thus, the inflow of moisture and oxygen to the organic light-emitting diode from the outside may be prevented or substantially prevented. Accordingly, damage to the organic light-emitting diode may be prevented or reduced.

The dam portion DP may extend so that the boundary BD between the intermediate display area MDA and the corner display area CDA may be defined, and may protrude in the thickness direction of the substrate 100 from the lower layer LL and/or the inorganic pattern layer PVX2. In an embodiment, the dam portion DP may be on the lower layer LL and/or the inorganic pattern layer PVX2.

The dam portion DP may include a first layer 118a and a second layer 119a on the first layer 118a. In this case, the first layer 118a and the pixel-defining layer 118 may include a same material. In addition, the first layer 118a and the pixel-defining layer 118 may be formed at the same time. The second layer 119a and the spacer 119 (e.g., see FIG. 7) may include a same material. In addition, the second layer 119a and the spacer 119 (e.g., see FIG. 7) may be formed at the same time.

The thin-film encapsulation layer TFE may cover the intermediate organic light-emitting diode MOLED. In addition, the thin-film encapsulation layer TFE may extend from the intermediate organic light-emitting diode MOLED to the second dam portion DP2. The thin-film encapsulation layer TFE may include at least one inorganic encapsulation layer and at least one organic encapsulation layer. For example, the thin-film encapsulation layer TFE may include the first inorganic encapsulation layer 310, the organic encapsulation layer 320, and the second inorganic encapsulation layer 330.

The first inorganic encapsulation layer 310 may cover the corner display area CDA and the intermediate display area MDA entirely and continuously. For example, the first inorganic encapsulation layer 310 may entirely and continuously cover the intermediate organic light-emitting diode MOLED, the groove Gv, and the dam portion DP. In an embodiment, the first inorganic encapsulation layer 310 may come in contact with the inorganic pattern layer PVX2. For example, the first inorganic encapsulation layer 310 may contact the protruding tip PT of the inorganic pattern layer PVX2.

The organic encapsulation layer 320 may be separated based on the dam portion DP. For example, the organic encapsulation layer 320 may extend from the corner display area CDA to the first dam portion DP1 and may extend from the intermediate display area MDA to the second dam portion DP2. Thus, the organic encapsulation layer 320 in the corner display area CDA may be spaced from (e.g., spaced apart from) the organic encapsulation layer 320 in the intermediate display area MDA. In this case, the organic encapsulation layer 320 may not be in the second extension groove EGv2.

The organic encapsulation layer 320 may extend from the intermediate organic light-emitting diode MOLED to the second dam portion DP2. In this case, the organic encapsulation layer 320 may fill the third extension groove EGv3 and the second groove Gv2. When the organic encapsulation layer 320 is formed, the third extension groove EGv3 and/or the second groove Gv2 may control the flow of organic materials included in the organic encapsulation layer 320. Thus, the organic materials included in the organic encapsulation layer 320 may flow from the intermediate organic light-emitting diode MOLED to the second dam portion DP2 and extend from the intermediate organic light-emitting diode MOLED to the second dam portion DP2.

Like the first inorganic encapsulation layer 310, the second inorganic encapsulation layer 330 may entirely and continuously cover the corner display area CDA and the intermediate display area MDA. In an embodiment, the second inorganic encapsulation layer 330 may come in contact with the first inorganic encapsulation layer 310 in the first dam portion DP1 and the second dam portion DP2. In addition, the second inorganic encapsulation layer 330 may contact the first inorganic encapsulation layer 310 in the second extension groove EGv2.

Referring to FIG. 8B, the lower layer LL may include the second insulating layer 116. In this case, the second insulating layer 116 may include a concave portion 116CC. In this case, the second groove Gv2 may be defined as the concave portion 116CC of the second insulating layer 116. Thus, the lower inorganic pattern layer PVX1 overlapping with the second groove Gv2 may be entirely covered by the second insulating layer 116. In an embodiment, when the second insulating layer 116 is formed, the concave portion 116CC of the second insulating layer 116 may be formed using a halftone mask.

In this case, a distance between an upper surface of the substrate 100 to an upper surface of the second insulating layer 116 facing the intermediate organic light-emitting diode MOLED may be greater than a distance from the upper surface of the substrate 100 to an upper surface of the second insulating layer 116 arranged between intermediate organic light-emitting diodes MOLED adjacent to each other.

In an embodiment, each of the first functional layer 212a, the second functional layer 212c, the opposite electrode 213, and the first inorganic encapsulation layer 310 may be continuously arranged in the concave portion 116CC of the second insulating layer 116. Thus, each of the opposite electrodes 213 of the intermediate organic light-emitting diode MOLED may not need to be separately connected to a power line.

In an embodiment, the second groove Gv2 and the first groove Gv1 may be defined differently. The second groove Gv2 may be defined as the concave portion 116CC of the second insulating layer 116, and the first groove Gv1 may be defined as the hole H in the second insulating layer 116 and the lower inorganic pattern layer PVX1.

Figure 9:
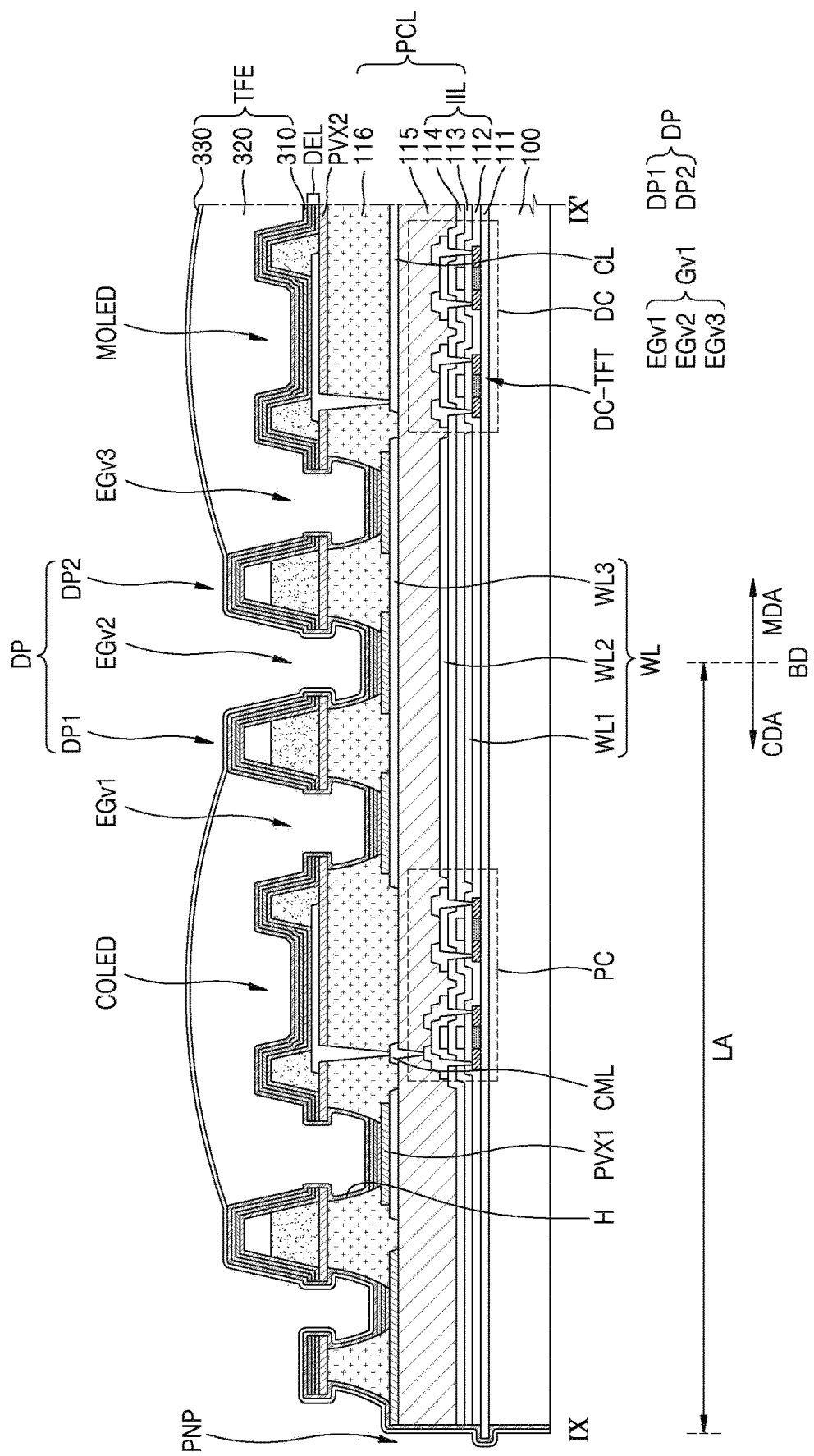
FIG. 9 is a schematic cross-sectional view of the display panel of FIG. 6B taken along the line IX-IX' according to an embodiment.

FIG. 9 is a schematic cross-sectional view of the display panel of FIG. 6B taken along the line IX-IX' according to an embodiment. In FIG. 9, the same reference numerals as those in FIG. 7 refer to the same members, and thus, a redundant description thereof may not be repeated.

Referring to FIG. 9, the display panel may include the substrate 100, the buffer layer 111, the pixel circuit layer PCL, the inorganic pattern layer PVX2, the dam portion DP, the display element layer DEL, and the thin-film encapsulation layer TFE. The substrate 100 may include the corner display area CDA and the intermediate display area MDA, and the pixel circuit layer PCL may include the inorganic insulating layer IIL, the first insulating layer 115, the second insulating layer 116, the line WL, and the driving circuit DC. The display element layer DEL may include a corner organic light-emitting diode COLED in the corner display area CDA and the intermediate organic light-emitting diode MOLED in the intermediate display area MDA.

In an embodiment, the corner display area CDA may include a plurality of extension areas LA each extending from the intermediate display area MDA. In one or more embodiments, the through portion PNP may be between the extension areas adjacent to each other. The through portion PNP may be defined as an empty space between the adjacent extension areas LA.

The buffer layer 111 may include a protruding tip extending to the through portion PNP. The protruding tip of the buffer layer 111 may prevent or substantially prevent a first functional layer and/or a second functional layer from being formed in the through portion PNP (e.g., as shown in the embodiment of FIG. 9).

A pixel circuit PC may be in the extension area LA. The pixel circuit PC may be covered by the first insulating layer 115 and may be connected to the connection electrode CML via a contact hole in the first insulating layer 115.

The second insulating layer 116 may cover the connection electrode CML and may include a hole H of the second insulating layer 116 that corresponds to the lower inorganic pattern layer PVX1. In one or more embodiments, the hole H of the second insulating layer 116 and the lower inorganic pattern layer PVX1 may together define the first groove Gv1.

The dam portion DP may be on the second insulating layer 116. The dam portion DP may be at the boundary BD between the corner display area CDA and the intermediate display area MDA. For example, the dam portion DP may be between the intermediate organic light-emitting diode MOLED and the corner organic light-emitting diode COLED.

The thin-film encapsulation layer TFE may cover the intermediate organic light-emitting diode MOLED and the corner organic light-emitting diode COLED. The thin-film encapsulation layer TFE may include at least one inorganic encapsulation layer and at least one organic encapsulation layer. For example, the thin-film encapsulation layer TFE may include the first inorganic encapsulation layer 310, the organic encapsulation layer 320, and the second inorganic encapsulation layer 330.

The first inorganic encapsulation layer 310 may entirely and continuously cover the corner display area CDA and the intermediate display area MDA. In addition, the first inorganic encapsulation layer 310 may extend to a side of the extension area LA defining the through portion PNP. In an embodiment, the first inorganic encapsulation layer 310 may contact protruding tip of the buffer layer 111.

The organic encapsulation layer 320 may be separated based on the dam portion DP. For example, the organic encapsulation layer 320 may extend from the corner organic light-emitting diode COLED to the first dam portion DP1 and may fill the first extension groove EGv1. In addition, the organic encapsulation layer 320 may extend from the intermediate organic light-emitting diode MOLED to the second dam portion DP2 and may fill the third extension groove EGv3. In one or more embodiments, the organic encapsulation layer 320 may not be filled in the second extension groove EGv2.

The second inorganic encapsulation layer 330 may entirely and continuously cover the corner display area CDA and the intermediate display area MDA. In addition, the second inorganic encapsulation layer 330 may extend to a side of the extension area LA defining the through portion PNP. The second inorganic encapsulation layer 330 may contact the first inorganic encapsulation layer 310 in the dam portion DP. The first inorganic encapsulation layer 310 may be between the protruding tip of the buffer layer 111 and the second inorganic encapsulation layer 330.

Figure 10:
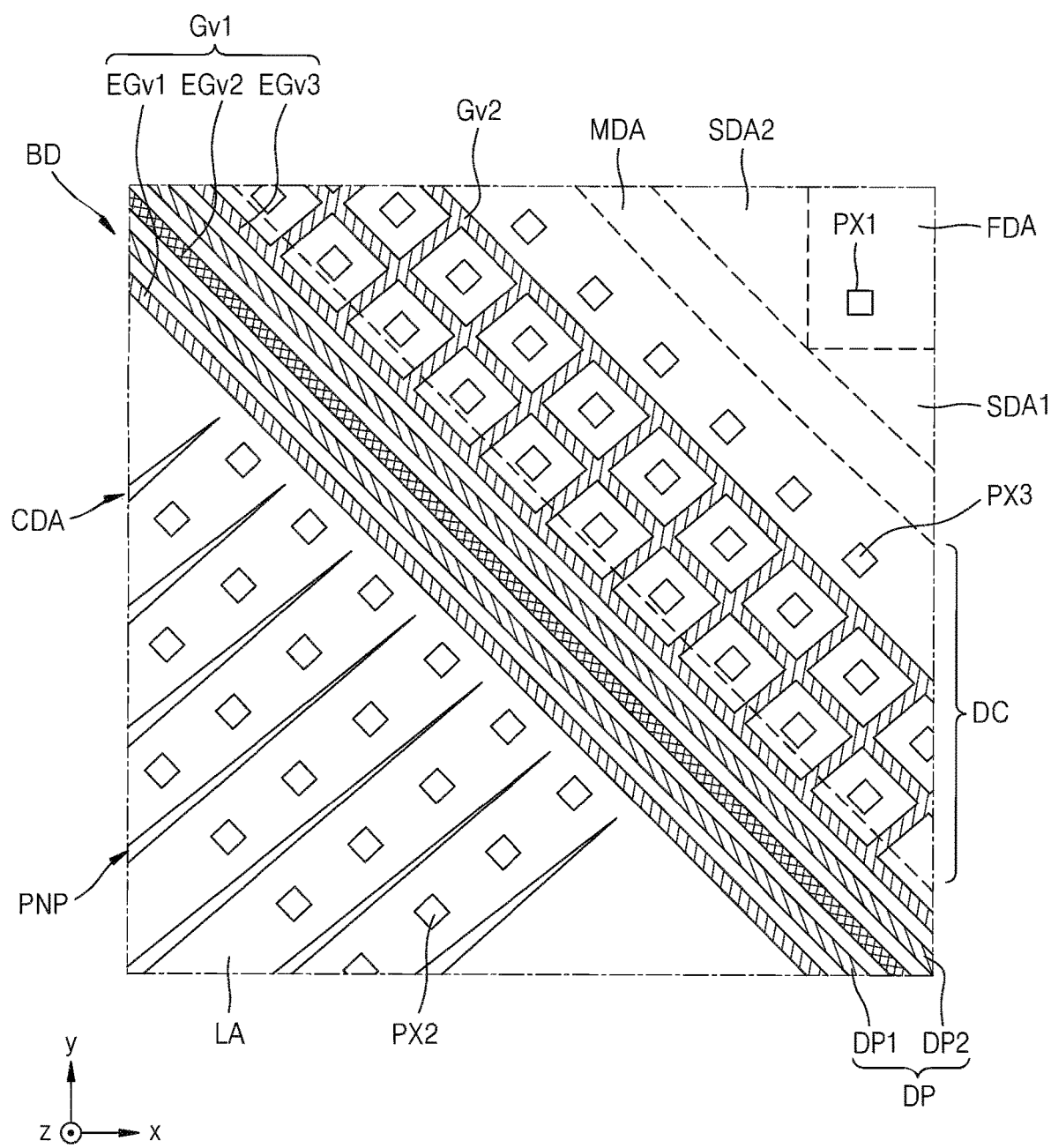
FIGS. 10-12 are plan views illustrating a second groove according to various embodiments.
Figure 11:
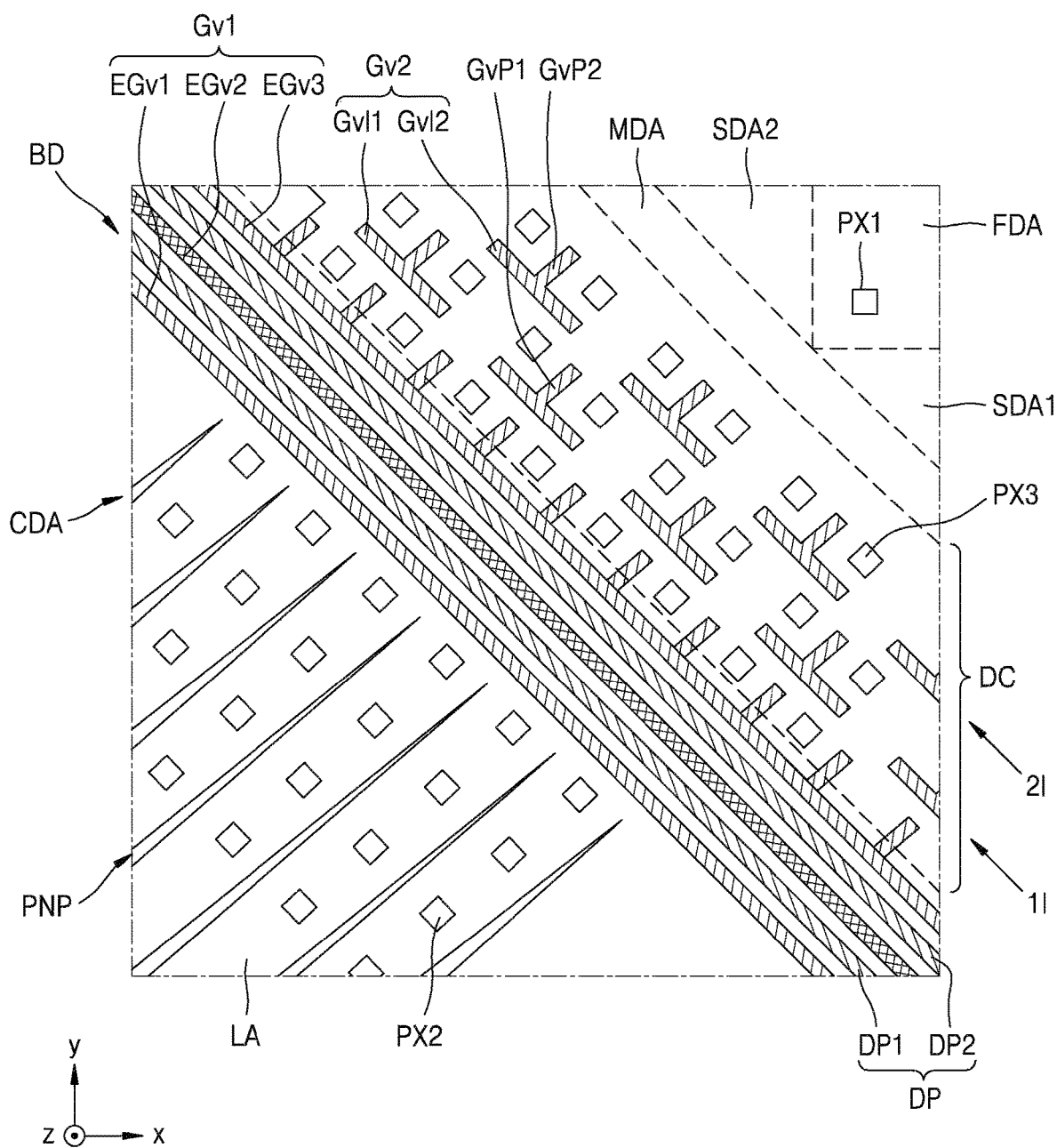
Figure 12:
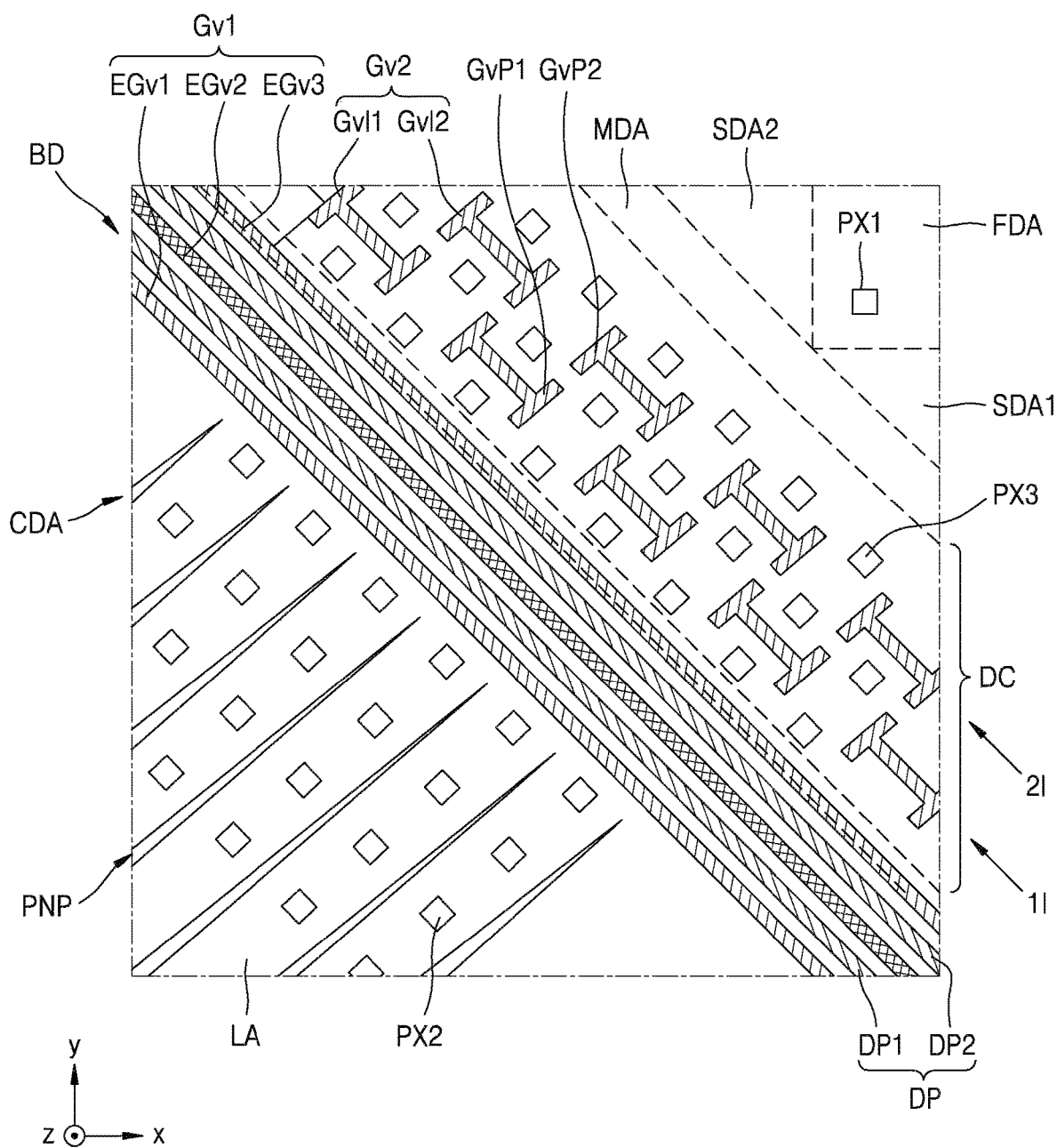

FIGS. 10-12 are plan views each illustrating the second groove GV2 according to various embodiments. FIGS. 10-12 are enlarged views of region XI of FIG. 5 according to various embodiments. In FIGS. 10-12, the same members as those of FIG. 6B are denoted by the same reference numerals, and thus, a redundant explanation may not be repeated.

Referring to FIGS. 10-12, the display panel may include a display area and a peripheral area, and the display area may include a front display area FDA, a side display area (e.g., the side display areas SDA1 and/or SDA2), a corner display area CDA, and an intermediate display area MDA.

A first pixel PX1 may be in the front display area FDA, a second pixel PX2 may be in the corner display area CDA, and a third pixel PX3 may be in the intermediate display area MDA. A plurality of third pixels PX3 may be in the intermediate display area MDA.

The display panel may include a dam portion DP on the substrate. The dam portion DP may protrude in the thickness direction of the substrate, and the dam portion DP may extend so that the boundary BD between the intermediate display area MDA and the corner display area CDA may be defined.

The display panel may include a groove on the substrate. The groove may be concave in the thickness direction of the substrate. The groove may include a first groove Gv1 and a second groove Gv2. The first groove Gv1 may extend in the same direction as the dam portion DP, and the second groove Gv2 may at least partially surround a display element of the third pixel PX3. In an embodiment, the second groove Gv2 may face at least one side of the third pixel PX3.

Referring to FIG. 10, the second groove Gv2 may at least partially surround each of the third pixels PX3. Some of the third pixels PX3 may be completely surrounded by the second groove Gv2. In an embodiment, the second groove Gv2 may surround the third pixel PX3 and be continuously arranged. In this case, the second groove Gv2 may be in a grid shape. In this case, the second groove Gv2 may control an organic material in at least one organic encapsulation layer. In addition, by utilizing (e.g., fully utilizing) an area between neighboring third pixels PX3, a width of the third extension groove EGv3 may be reduced.

Referring to FIGS. 11 and 12, a portion of the second groove Gv2 may extend in the same direction as the dam portion DP. In this case, the second groove Gv2 may at least partially surround the display element of the third pixel PX3.

In addition, a plurality of second grooves Gv2 may be in the intermediate display area MDA and may be spaced from (e.g., spaced apart from) each other. In an embodiment, the second grooves Gv2 may be spaced from (e.g., spaced apart from) one another in the same shape.

In an embodiment, the second groove Gv2 may be on a first line 1*l* and a second line 2*l*. Each of the first line 1*l* and the second line 2*l* may be virtual lines parallel to the dam portion DP. The second line 2*l* may be a line farther from the dam portion DP than the first line 1*l*. For example, the second groove Gv2 may include a first line second groove Gvl1 and a second line second groove Gvl2. A plurality of first line second grooves Gvl1 may be arranged along the first line 1*l* and may be spaced from (e.g., spaced apart from) one another. In addition, a plurality of second line second grooves Gvl2 may be arranged along the second line 2*l* and may be spaced from (e.g., spaced apart from) one another. In this case, the first line second grooves Gvl1 and the second line second grooves Gvl2 may be alternately arranged. For example, the second line second groove Gvl2 may be between the first line second grooves Gvl1 adjacent to each other.

The first line second grooves Gvl1 may include a first portion GvP1 extending in a direction crossing a direction in which the dam portion DP extends (e.g., in a plan view), and the second line second groove Gvl2 may include a second portion GvP2 extending in a direction crossing the direction in which the dam portion DP extends (e.g., in a plan view).

Referring to FIG. 11, the first portion GvP1 and the second portion GvP2 may each extend in directions parallel with each other.

Referring to FIG. 12, the first portion GvP1 and the second portion GvP2 may be on the same line.

Figure 13A:
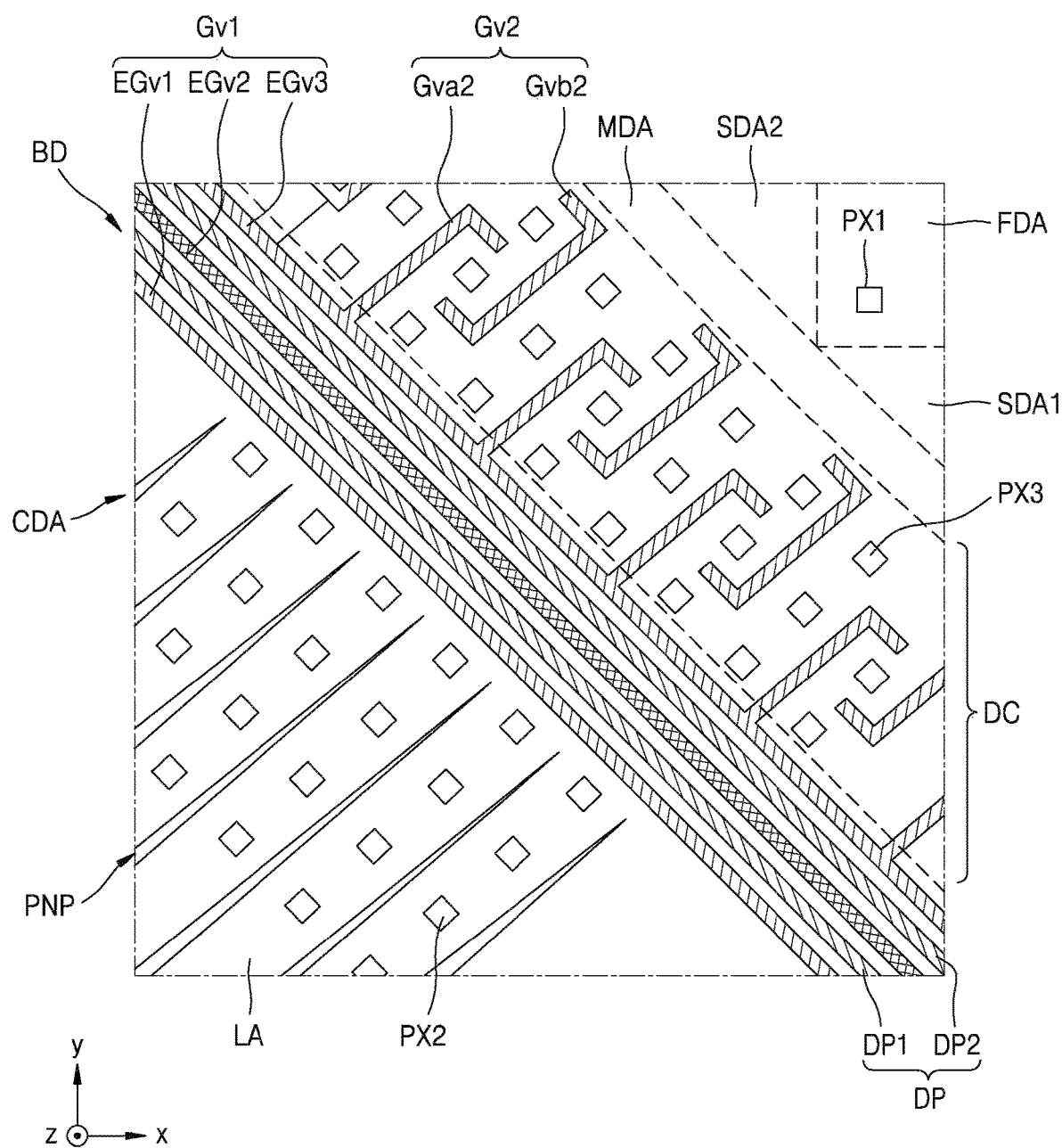
FIGS. 13A and 13B are plan views each illustrating a second groove according to various embodiments.
Figure 13B:
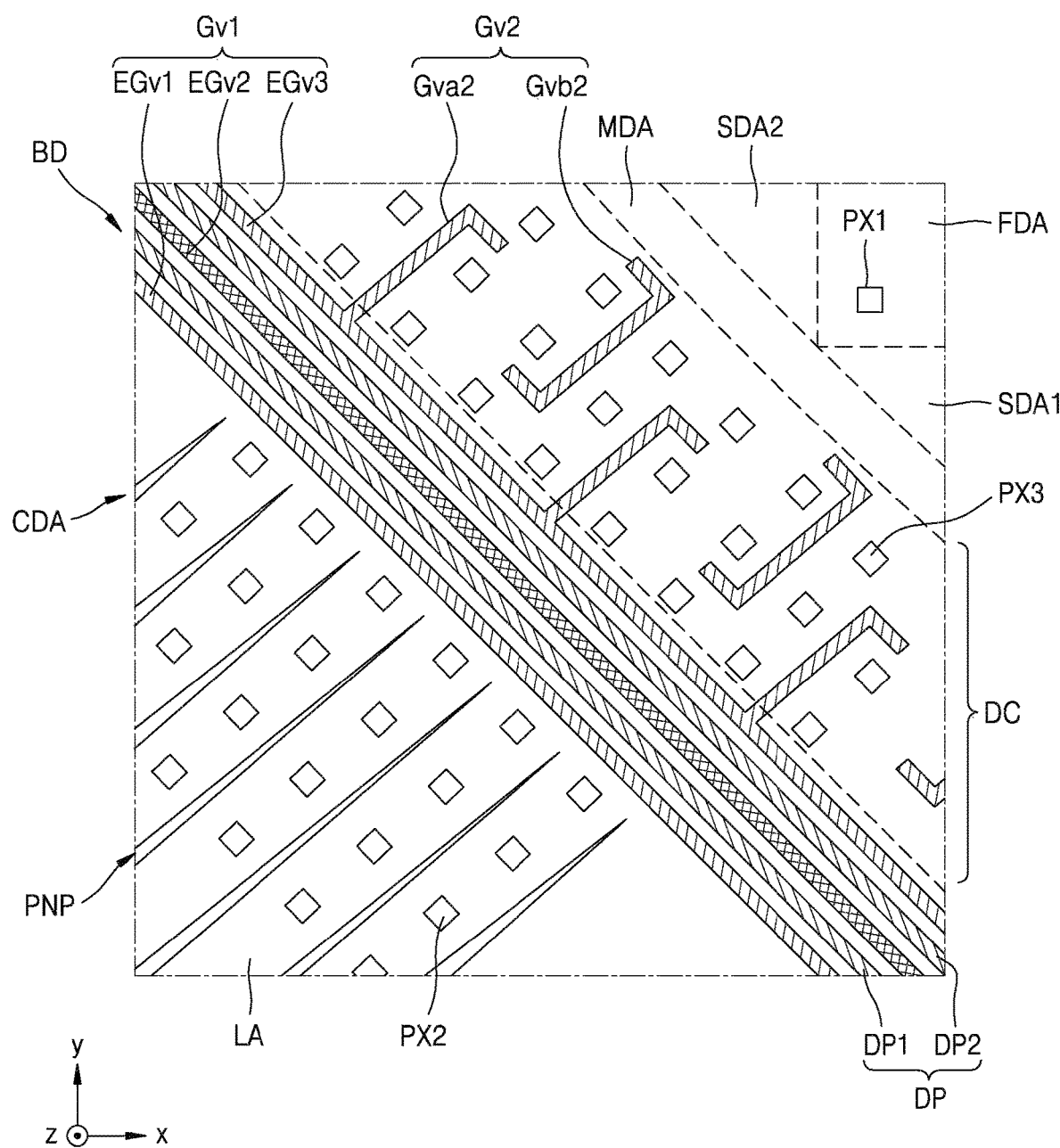

FIGS. 13A and 13B are plan views each illustrating the second groove Gv2 according to various embodiments. FIGS. 13A and 13B are enlarged views of region VI of FIG. 5 according to various embodiments. In FIGS. 13A and 13B, the same members as those of FIG. 6B are denoted by the same reference numerals, and thus, a redundant explanation may not be repeated.

Referring to FIGS. 13A and 13B, the display panel may include a display area and a peripheral area, and the display area may include a front display area FDA, a side display area (e.g., the side display areas SDA1 and/or SDA2), a corner display area CDA, and an intermediate display area MDA.

A first pixel PX1 may be in the front display area FDA, a second pixel PX2 may be in the corner display area CDA, and a third pixel PX3 may be in the intermediate display area MDA. A plurality of third pixels PX3 may be in the intermediate display area MDA.

The display panel may include a dam portion DP on a substrate. The dam portion DP may protrude in the thickness direction of the substrate, and the dam portion DP may extend so that the boundary BD between the intermediate display area MDA and the corner display area CDA may be defined.

The display panel may include a groove on the substrate. The groove may be concave in the thickness direction of the substrate. The groove may include a first groove Gv1 and a second groove Gv2. The first groove Gv1 may extend in the same direction as the dam portion DP, and the second groove Gv2 may at least partially surround a display element of the third pixel PX3. In an embodiment, the second groove Gv2 may face at least one side of the display element of the third pixel PX3.

A plurality of second grooves Gv2 may be in the intermediate display area MDA. Some of the plurality of second grooves Gv2 may be provided integrally with the third extension groove EGv3. The other ones of the second groove Gv2 may be spaced from (e.g., spaced apart from) the third extension groove EGv3. In an embodiment, the second groove Gv2 may include a first groove portion Gva2 and a second groove portion Gvb2. The first groove portion Gva2 may be provided integrally with the third extension groove EGv3. The second groove portion Gvb2 may be spaced from (e.g., spaced apart from) the third extension groove EGv3.

Referring to FIG. 13A, each of the first groove portion Gva2 and the second groove portion Gvb2 may be repeatedly arranged in an extension direction of the dam portion DP with two third pixels PX3 therebetween. The third pixels PX3 may be repeatedly arranged in the extension direction.

Referring to FIG. 13B, each of the first groove portion Gva2 and the second groove portion Gvb2 may be repeatedly arranged in an extension direction of the dam portion DP with three third pixels PX3 therebetween. The third pixels PX3 may be repeatedly arranged in the extension direction. As described above, each of the first groove portion Gva2 and the second groove portion Gvb2 may be repeatedly arranged in an extension direction of the dam portion DP with a plurality of third pixels PX3 therebetween.

Figure 14:
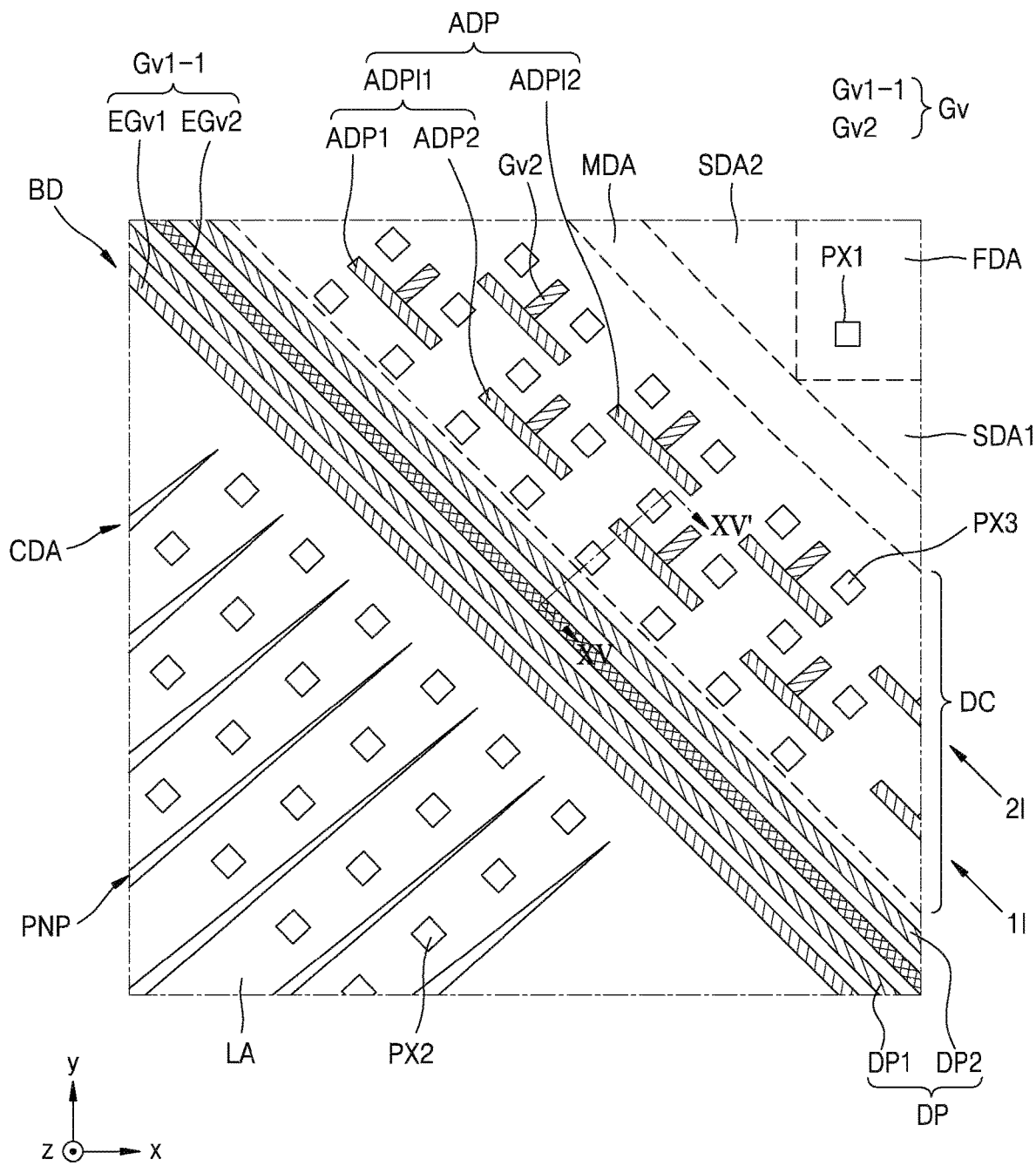
FIG. 14 is a plan view illustrating a second groove according to various embodiments.

FIG. 14 is a plan view illustrating the second groove Gv2 according to various embodiments. In FIG. 14, the same members as those of FIGS. 6A and 6B are denoted by the same reference numerals, and thus, a redundant explanation may not be repeated.

Referring to FIG. 14, the display panel may include a display area and a peripheral area, and the display area may include a front display area FDA, a side display area (e.g., the side display areas SDA1 and/or SDA2), a corner display area CDA, and an intermediate display area MDA.

A first pixel PX1 may be in the front display area FDA, a second pixel PX2 may be in the corner display area CDA, and a third pixel PX3 may be in the intermediate display area MDA. A plurality of third pixels PX3 may be in the intermediate display area MDA.

The display panel may include a dam portion DP on a substrate. The dam portion DP may protrude in a thickness direction of the substrate, and the dam portion DP may extend so that the boundary BD between the intermediate display area MDA and the corner display area CDA may be defined. The dam portion DP may include a first dam portion DP1 and a second dam portion DP2.

The display panel may include a groove Gv on the substrate. The groove Gv may be concave in a thickness direction of the substrate. The groove Gv may include a first groove Gv1-1 and a second groove Gv2.

The first groove Gv1-1 may extend between the second pixel PX2 and the third pixel PX3. In one or more embodiments, the first groove Gv1-1 may extend in parallel with the dam portion DP. In an embodiment, the first groove Gv1-1 may include a first extension groove EGv1 and a second extension groove EGv2.

The first extension groove EGv1 may be between the second pixel PX2 and the first dam portion DP1. The second extension groove EGv2 may be between the first dam portion DP1 and the second dam portion DP2. In this case, the first extension groove EGv1 and the second extension groove EGv2 may extend in parallel with the first dam portion DP1 and the second dam portion DP2. In an embodiment, the first groove Gv1-1 may further include a third extension groove. In this case, the third extension groove may extend in parallel with the first dam portion DP1 and the second dam portion DP2. The second dam portion DP2 may be between the third extension groove and the second extension groove EGv2.

The display panel may further include an auxiliary dam portion ADP on the substrate. Similar to the dam portion DP, the auxiliary dam portion ADP may protrude in the thickness direction of the substrate.

The auxiliary dam portion ADP may be in the intermediate display area MDA and extend in parallel with the dam portion DP. In addition, a thickness of the auxiliary dam portion ADP may be less than that of the dam portion DP. This will be described in more detail below.

The auxiliary dam portion ADP may be arranged along the first line 1*l* and the second line 2*l*. The first line 1*l* and the second line 2*l* may be virtual lines parallel with the dam portion DP. The second line 2*l* may be a line farther from the dam portion DP than the first line 1*l* is to the dam portion DP. For example, the auxiliary dam portion ADP may include a first line auxiliary dam portion ADPl1 and a second line auxiliary dam portion ADPl2. A plurality of first line auxiliary dam portions ADPl1 may be arranged along the first line 1*l* and may be spaced from (e.g., spaced apart from) one another. For example, a first auxiliary dam portion ADP1 and a second auxiliary dam portion ADP2 may be spaced from (e.g., spaced apart from) each other in the extension direction of the dam portion DP. In addition, a plurality of second line auxiliary dam portions ADPl2 may be arranged along the second line 2*l* and may be spaced from (e.g., spaced apart from) one another. In this case, the first line auxiliary dam portion ADPl1 and the second line auxiliary dam portion ADPl2 may be alternately arranged. For example, the second line auxiliary dam portion ADPl2 may be arranged between first line auxiliary dam portions ADPl1 that are adjacent to each other.

The second groove Gv2 may extend in a direction crossing the direction in which the dam portion DP extends (e.g., in a plan view). The second groove Gv2 may extend between third pixels PX3 adjacent to each other. In this case, a plurality of second grooves Gv2 may be in the intermediate display area MDA, and the second grooves Gv2 may correspond to the auxiliary dam portions ADP, respectively. The second groove Gv2 may control an organic material so that the organic material forming at least one organic encapsulation layer may spread (e.g., fully spread) in the intermediate display area MDA. In one or more embodiments, the auxiliary dam portion ADP may correspond to each of the second grooves Gv2, and the auxiliary dam portion ADP together with the second groove Gv2 may control the organic material forming the at least one organic encapsulation layer to spread (e.g., fully spread) in the intermediate display area MDA.

Figure 15A:
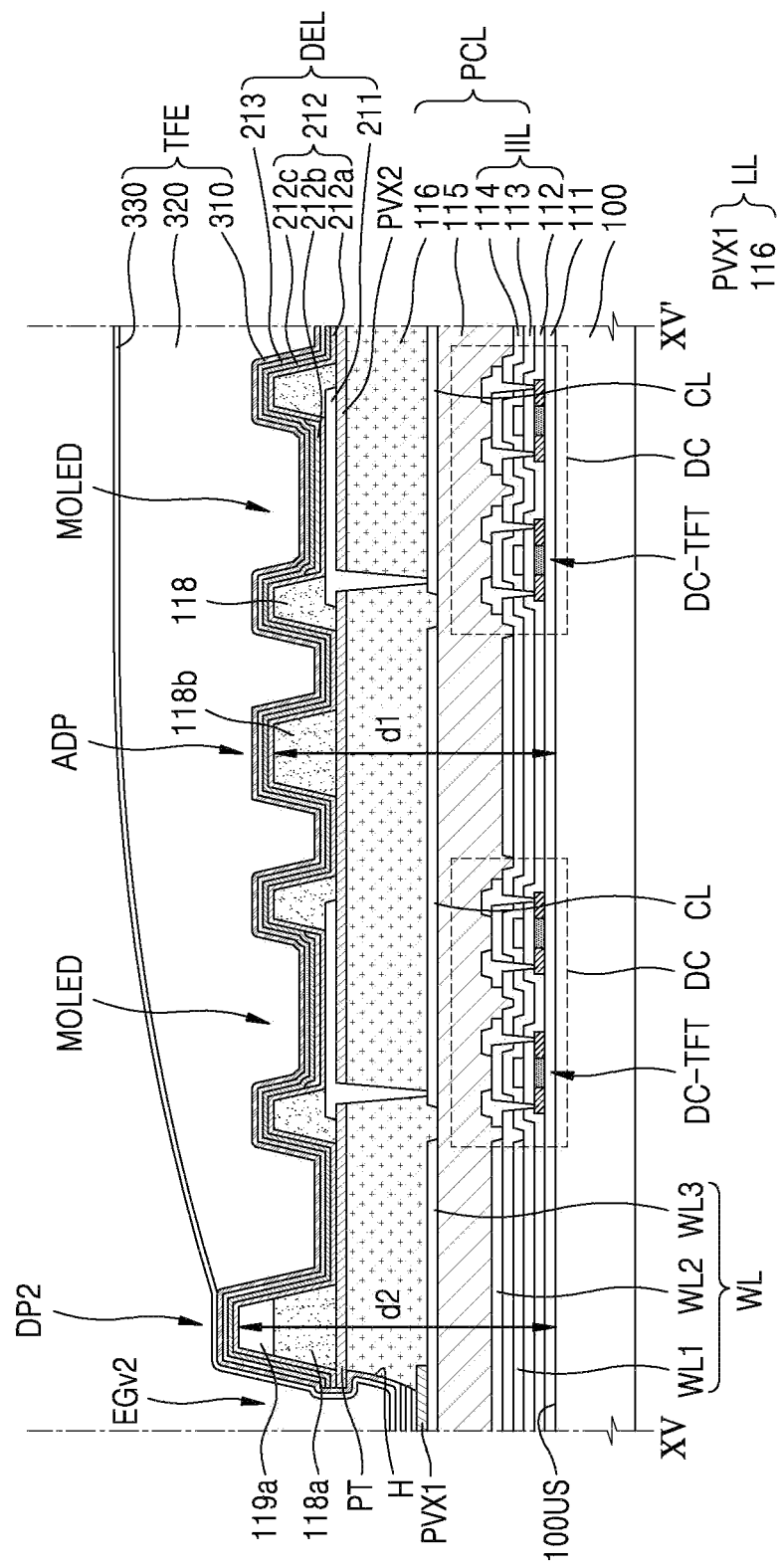
FIGS. 15A and 15B are schematic cross-sectional views of the display panel of FIG. 14 taken along the line XV-XV' according to an embodiment.
Figure 15B:
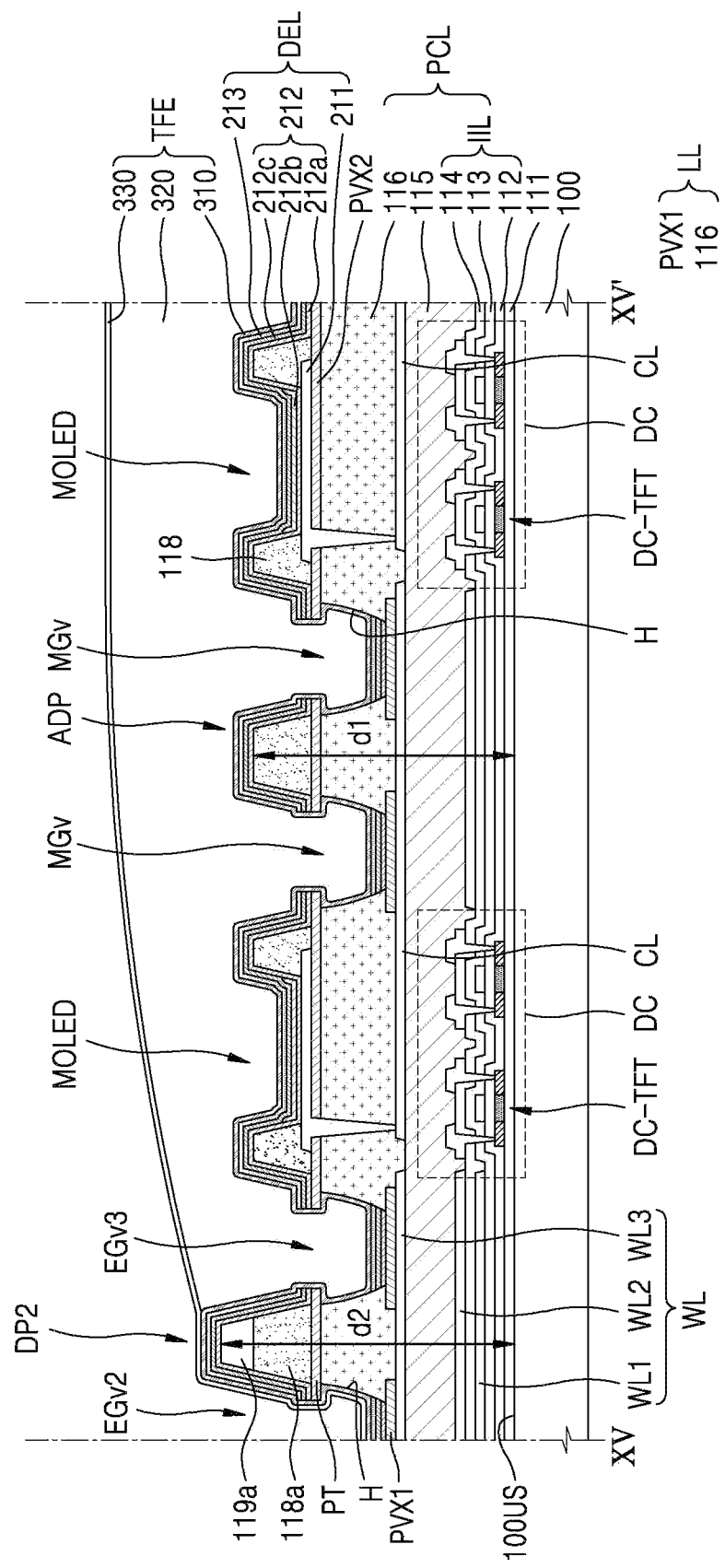

FIGS. 15A and 15B are schematic cross-sectional views of the display panel of FIG. 14 taken along the line XV-XV' according to an embodiment. In FIGS. 15A and 15B, the same members as those of FIG. 8A are denoted by the same reference numerals, and thus, a redundant explanation may not be repeated.

Referring to FIGS. 15A and 15B, the display panel may include a substrate 100, a buffer layer 111, a pixel circuit layer PCL, an inorganic pattern layer PVX2, a dam portion DP, an auxiliary dam portion ADP, a display element layer DEL, and a thin-film encapsulation layer TFE. The substrate 100 may include a corner display area CDA and an intermediate display area MDA, and the pixel circuit layer PCL may include an inorganic insulating layer IIL, a first insulating layer 115, a second insulating layer 116, a line WL, and a driving circuit DC. The display element layer DEL may include an intermediate organic light-emitting diode MOLED as an intermediate display element.

The auxiliary dam portion ADP may be in the intermediate display area MDA. For example, the auxiliary dam portion ADP may be on the lower layer LL and/or the inorganic pattern layer PVX2. For example, the auxiliary dam portion ADP may be on the second insulating layer 116. In an embodiment, the auxiliary dam portion ADP may protrude in the thickness direction of the substrate 100 from the lower layer LL and/or the inorganic pattern layer PVX2.

The auxiliary dam portion ADP may include a first layer 118*b*. The first layer 118*b* of the auxiliary dam portion ADP may include the same material as the pixel-defining layer 118. Further, the first layer 118*b* of the auxiliary dam portion ADP may be formed concurrently (e.g., simultaneously) when the pixel-defining layer 118 is formed.

A first distance d1 between an upper surface 100US of the substrate 100 and an upper surface of the auxiliary dam portion ADP may be less than a second distance d2 between the upper surface of the dam portion DP and the upper surface 100US of the substrate 100. In addition, a thickness of the auxiliary dam portion ADP may be less than that of the dam portion DP. In this case, the thickness of the auxiliary dam portion ADP may be defined as a distance from a lower surface of the first layer 118*b* of the auxiliary dam portion ADP facing the inorganic pattern layer PVX2 to an upper surface of the first layer 118*b* of the auxiliary dam portion ADP. The thickness of the dam portion DP may be defined as a distance from a lower surface of the first layer 118*a* of the dam portion DP facing the inorganic pattern layer PVX2 to an upper surface of the second layer 119*a* of the dam portion DP.

The auxiliary dam portion ADP may be covered by the thin-film encapsulation layer TFE. For example, the auxiliary dam portion ADP may be covered by the organic encapsulation layer 320. In this case, the auxiliary dam portion ADP may control the organic material forming the organic encapsulation layer 320 to spread (e.g., spread well) throughout the intermediate display area MDA. Thus, the organic encapsulation layer 320 may extend to the second dam portion DP2 and be formed in the intermediate display area MDA overall.

Referring to FIG. 15A, the second insulating layer 116 may be continuously arranged between the intermediate organic light-emitting diode MOLED and the auxiliary dam portion ADP. The display panel may not include a groove between the intermediate organic light-emitting diode MOLED and the auxiliary dam portion ADP.

Referring to FIG. 15B, the display panel may include an intermediate groove MGv between the intermediate organic light-emitting diode MOLED and the auxiliary dam portion ADP. In an embodiment, the second insulating layer 116 may include a hole H between the intermediate organic light-emitting diode MOLED and the auxiliary dam portion ADP. In this case, the lower inorganic pattern layer PVX1 and the hole H of the second insulating layer 116 may together define the intermediate groove MGv. In an embodiment, a plurality of intermediate grooves MGv may be provided, and the auxiliary dam portion ADP may be between intermediate grooves MGv adjacent to each other. In an embodiment, the third extension groove EGv3 may be between the intermediate organic light-emitting diode MOLED and the second dam portion DP2.

Figure 16:
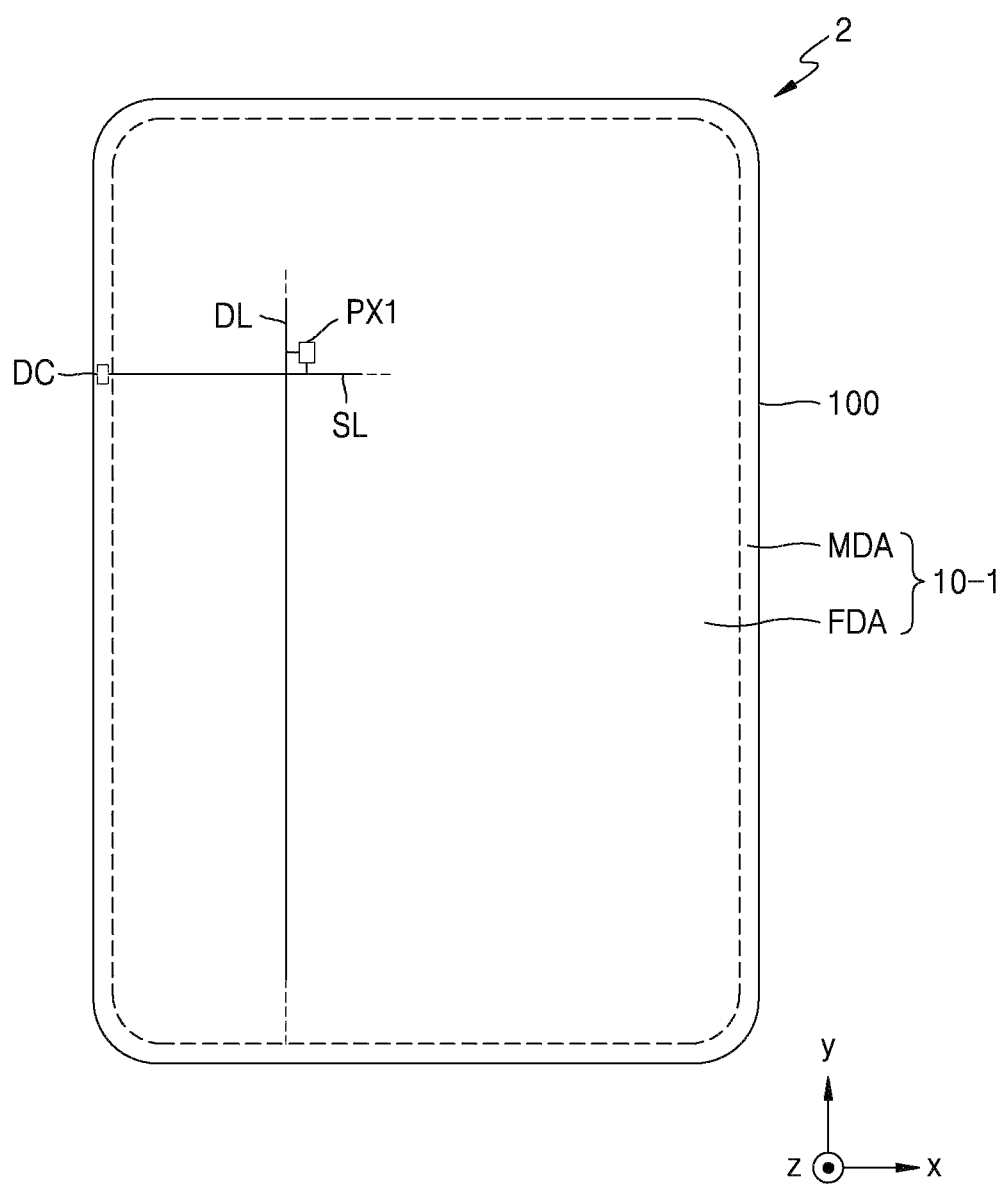
FIG. 16 is a plan view schematically illustrating a display device according to another embodiment.
Figure 17:
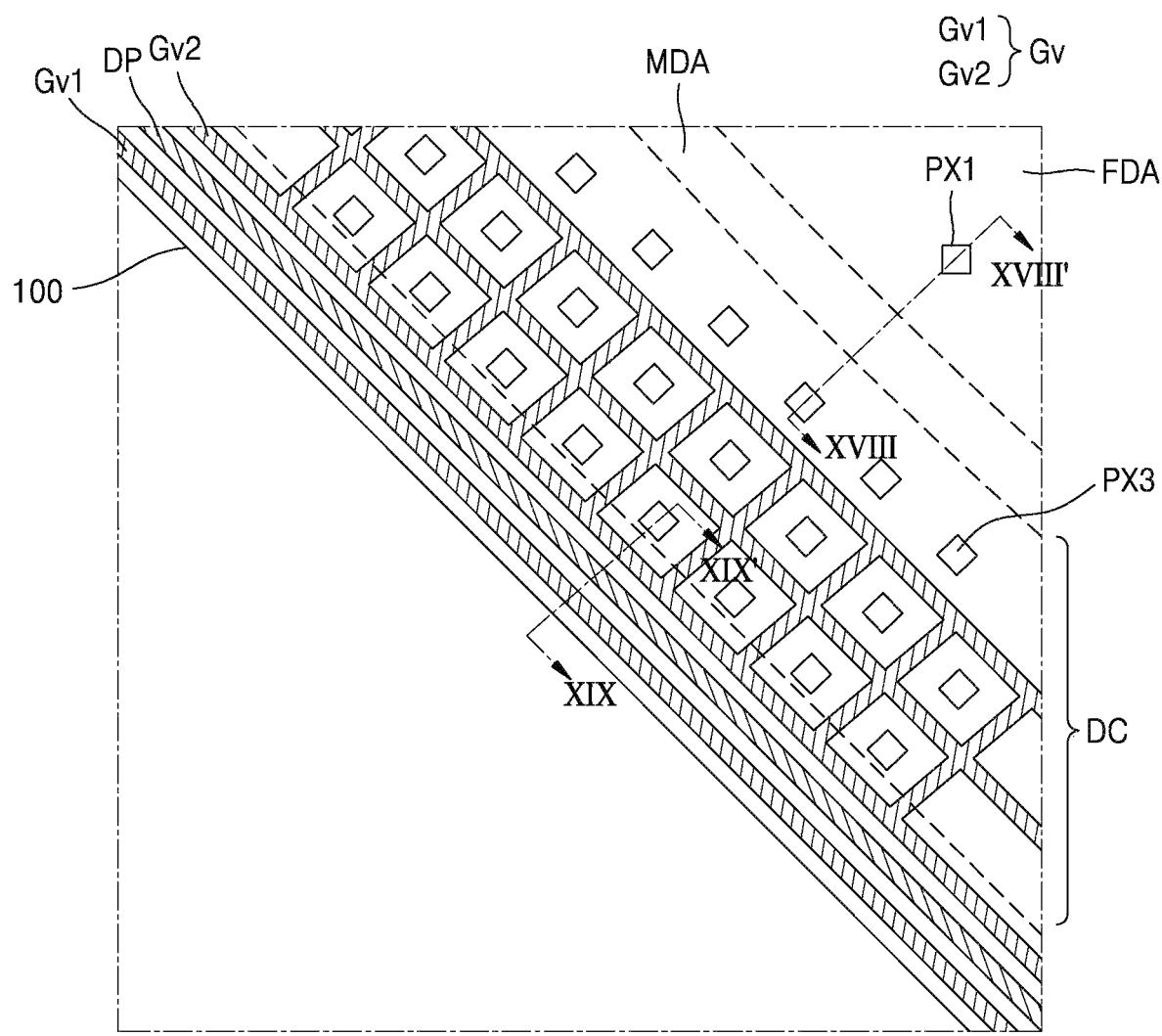
FIG. 17 is an enlarged view of a portion of a display panel according to an embodiment.

FIG. 16 is a plan view schematically illustrating a display device 2 according to another embodiment. FIG. 17 is an enlarged view of a portion of a display panel according to an embodiment. In FIGS. 16 and 17, the same members as those of FIG. 4 are denoted by the same reference numerals, and thus, a redundant explanation may not be repeated.

Referring to FIG. 16, the display device 2 may include a display panel 10-1. The display panel 10-1 may include a front display area FDA and an intermediate display area MDA at least partially surrounding the front display area FDA. In an embodiment, the intermediate display area MDA may entirely surround the front display area FDA.

The display panel 10-1 may include a substrate 100 and a multilayer film on the substrate 100. In this case, each of the front display area FDA and the intermediate display area MDA may be defined on the substrate 100 and/or the multilayer film. In other words, the substrate 100 and/or the multilayer film may include the front display area FDA and the intermediate display area MDA.

A first pixel PX1 including a front display element may be in the front display area FDA. The driving circuit DC for providing an electrical signal or a power line for providing a voltage may be in the intermediate display area MDA.

Further, a third pixel including an intermediate display element may be in the intermediate display area MDA. Thus, an image may be displayed in the display panel 10-1 (e.g., a major portion of the display panel 10-1).

Referring to FIG. 17, the third pixel PX3 including a display element may be in the intermediate display area MDA. In addition, in an embodiment, a driving circuit DC for providing an electrical signal or a power line for providing a voltage may be in the intermediate display area MDA as well.

A plurality of third pixel PX3 may each overlap with the driving circuit DC. For example, an intermediate display element of the third pixel PX3 may overlap with the driving circuit DC. In one or more embodiments, the driving circuit DC may supply an electrical signal to the pixel circuit PC (e.g., see FIG. 3) through a signal line. For example, the driving circuit DC may be connected to the scan line SL (e.g., see FIG. 3) to supply a scan signal to the pixel circuit PC (e.g., see FIG. 3).

The dam portion DP may be outside the intermediate display area MDA. The dam portion DP may protrude in a thickness direction of the substrate. The dam portion DP may extend along an edge of the substrate 100.

The display panel may include a groove Gv on the substrate. The groove Gv may be concave in a thickness direction of the substrate. The groove Gv may include a first groove Gv1 and a second groove Gv2.

The first groove Gv1 may extend in parallel with the dam portion DP. The second groove Gv2 may extend between third pixels PX3 that are adjacent to each other. Similar to the first groove Gv1, the second groove Gv2 may be concave in the thickness direction of the substrate.

Figure 18:
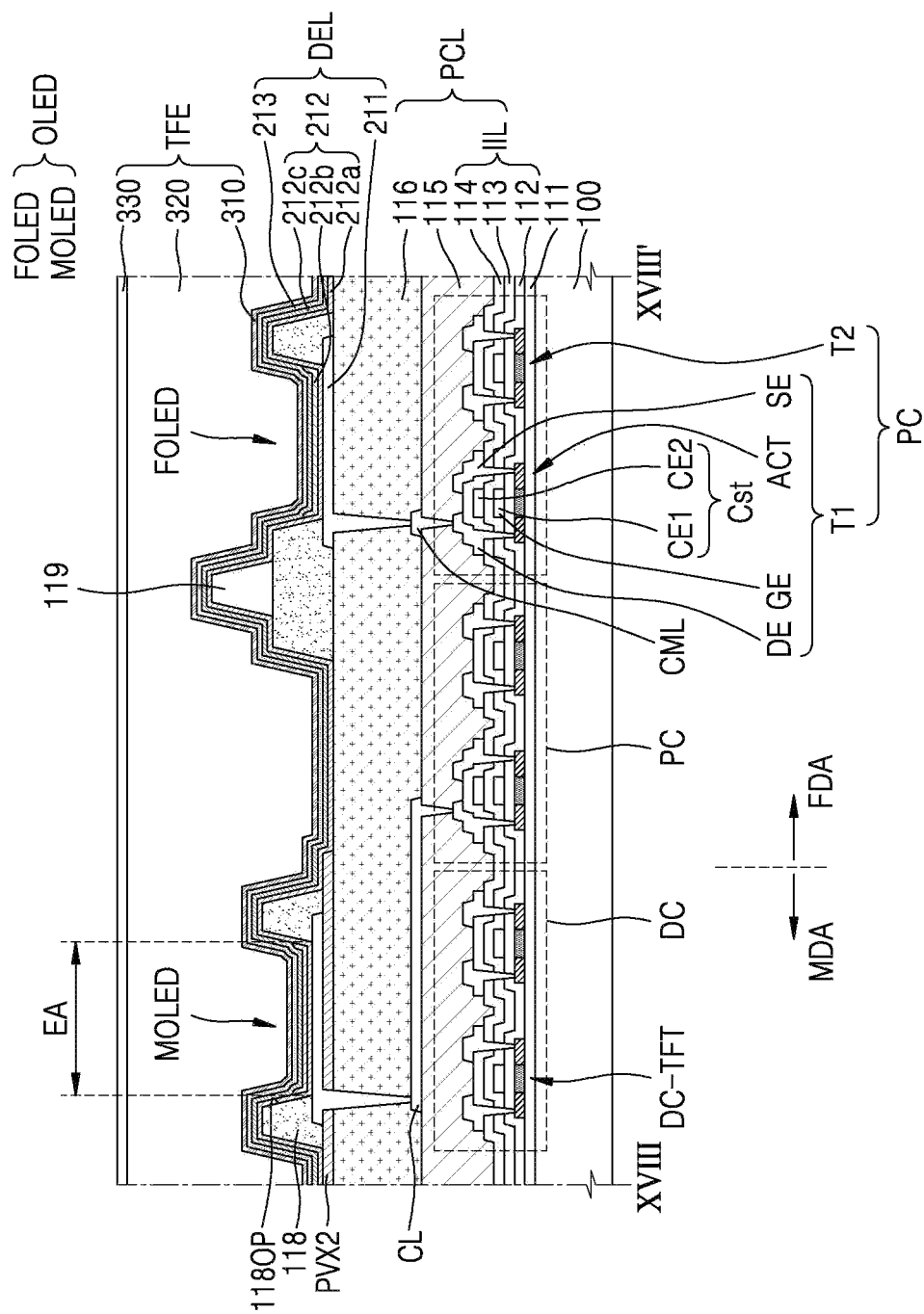
FIG. 18 is a schematic cross-sectional view of the display panel of FIG. 17 taken along the line XVIII-XVIII' according to an embodiment.

FIG. 18 is a schematic cross-sectional view of a display panel of FIG. 17 taken along the line XVIII-XVIII' according to an embodiment. In FIG. 18, as the same reference numerals as those in FIG. 7 denote the same elements, a redundant description thereof may not be repeated.

Referring to FIG. 18, the display panel may include a substrate 100, a buffer layer 111, a pixel circuit layer PCL, an inorganic pattern layer PVX2, a dam portion DP, a display element layer DEL, and a thin-film encapsulation layer TFE. The substrate 100 may include a front display area FDA and an intermediate display area MDA, and the pixel circuit layer PCL may include a driving circuit DC and a pixel circuit PC. In an embodiment, the driving circuit DC may be in the intermediate display area MDA. The pixel circuit PC may be spaced from (e.g., spaced apart from) the intermediate display area MDA. In an embodiment, the pixel circuit PC may be in the front display area FDA.

The driving circuit DC may include a driving circuit thin-film transistor DC-TFT. In an embodiment, the driving circuit DC may be connected to a scan line. The pixel circuit PC may include a driving thin-film transistor T1, a switching thin-film transistor T2, and a storage capacitor Cst.

The connection line CL may be on the first insulating layer 115 and may be connected to the pixel circuit PC via a contact hole in the first insulating layer 115. The connection line CL may extend from the front display area FDA to the intermediate display area MDA. In this case, the connection line CL may overlap with the driving circuit thin-film transistor DC-TFT. The pixel electrode 211 of the intermediate organic light-emitting diode MOLED may be connected to the connection line CL via a contact hole in the second insulating layer 116.

Figure 19:
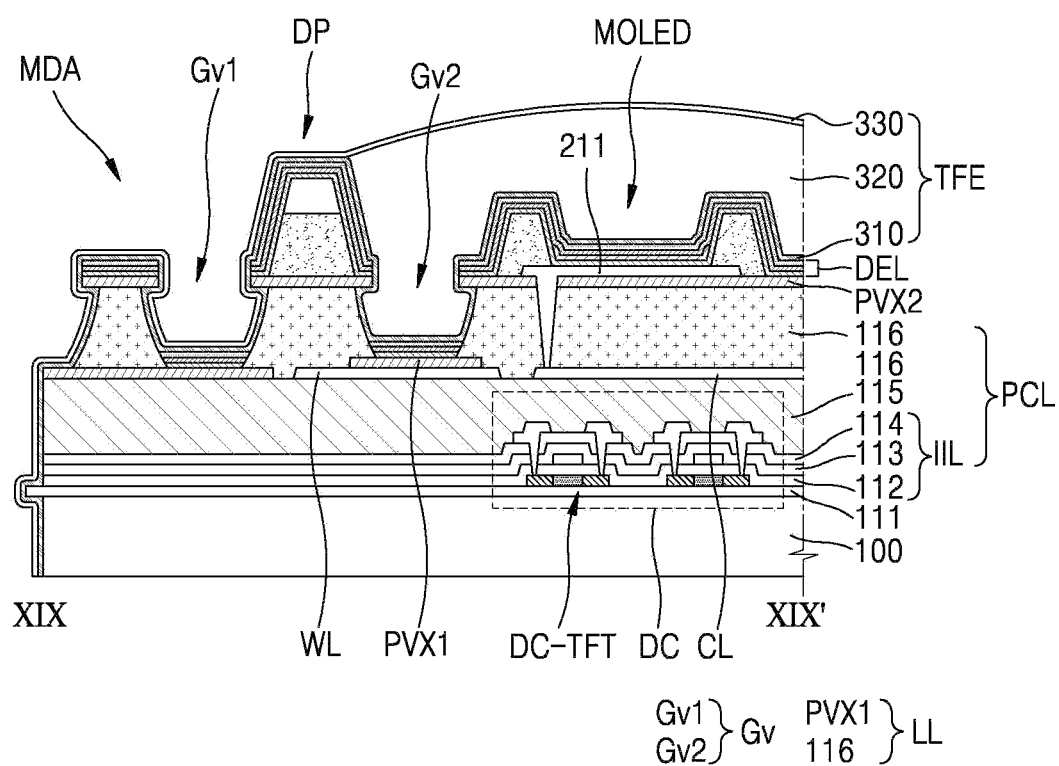
FIG. 19 is a schematic cross-sectional view of the display panel of FIG. 17 taken along the line XIX-XIX' according to an embodiment.

FIG. 19 is a schematic cross-sectional view of the display panel of FIG. 17 taken along the line XIX-XIX' according to an embodiment.

Referring to FIG. 19, the display panel may include a substrate 100, a buffer layer 111, a pixel circuit layer PCL, a dam portion DP, a display element layer DEL, and a thin-film encapsulation layer TFE. The substrate 100 may include an intermediate display area MDA, and the pixel circuit layer PCL may include an inorganic insulating layer IIL, a first insulating layer 115, a second insulating layer 116, a line WL, and a driving circuit DC. The display element layer DEL may include an intermediate organic light-emitting diode MOLED as an intermediate display element, which may overlap with the driving circuit DC.

The lower layer LL including a groove Gv concave in a thickness direction of the substrate 100 may be between the substrate 100 and the pixel electrode 211 of the intermediate organic light-emitting diode MOLED.

The dam portion DP may protrude in the thickness direction of the substrate 100 from the lower layer LL and/or the inorganic pattern layer PVX2 and be outside the intermediate display area MDA.

The thin-film encapsulation layer TFE may cover the intermediate organic light-emitting diode MOLED and may extend to the dam portion DP. In this case, the thin-film encapsulation layer TFE may include at least one inorganic encapsulation layer and at least one organic encapsulation layer. For example, the thin-film encapsulation layer TFE may include a first inorganic encapsulation layer 310, an organic encapsulation layer 320, and a second inorganic encapsulation layer 330.

The groove Gv may include a first groove Gv1 and a second groove Gv2. In an embodiment, the first groove Gv1 may be outside the dam portion DP, and the second groove Gv2 may be between the intermediate organic light-emitting diode MOLED and the dam portion DP. In this case, the organic encapsulation layer 320 may be filled in the second groove Gv2.

In the present embodiment, the second groove Gv2 may control the flow of organic materials in the organic encapsulation layer 320. Therefore, the organic encapsulation layer 320 may extend to the dam portion DP and may cover (e.g., fully cover) the intermediate display area MDA. Accordingly, the intermediate organic light-emitting diode MOLED adjacent to the dam portion DP may be protected by the thin-film encapsulation layer TFE. In this case, an image may be displayed on a major portion of the display panel.

As described above, the groove Gv may include a first groove Gv1 and a second groove Gv2, wherein the first groove Gv1 extends in parallel with the dam portion, and the second groove Gv2 extends in a direction crossing an extension direction of the dam portion in the intermediate display area. Thus, the second groove Gv2 may precisely control the flow of organic materials forming at least one organic encapsulation layer covering the intermediate display element.

In addition, a space occupied by the dam portion and the first groove may be reduced, and thus, the resolution of the display panel may improve.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel comprising:
   a substrate comprising:
      a front display area;
      a first side display area connected to the front display area in a first direction;
      a second side display area connected to the front display area in a second direction crossing the first direction;
      a corner display area arranged between the first side display area and the second side display area, the corner display area surrounding the front display area; and
      an intermediate display area arranged between the front display area and the corner display area;
   an intermediate display element arranged in the intermediate display area and comprising a pixel electrode;
   a lower layer arranged between the substrate and the pixel electrode, the lower layer comprising a groove concave in a thickness direction of the substrate; and
   a dam portion on the lower layer, extending to define a boundary between the intermediate display area and the corner display area, and protruding in the thickness direction of the substrate,
   wherein the groove comprises a first groove and a second groove, the first groove extending in parallel with the dam portion, and the second groove extending in a direction crossing a direction in which the dam portion extends in the intermediate display area.

2. The display panel of claim 1, wherein the corner display area comprises a plurality of extension areas each extending from the intermediate display area,
   wherein a through portion is between the plurality of extension areas that are adjacent to each other,
   wherein the intermediate display element comprises a first intermediate display element and a second intermediate display element each facing the plurality of extension areas, and
   wherein the second groove extends between the first intermediate display element and the second intermediate display element.

3. The display panel of claim 1, wherein a plurality of intermediate display elements are in the intermediate display area, and
   wherein the second groove at least partially surrounds each of the plurality of intermediate display elements.

4. The display panel of claim 1, further comprising:
   a corner display element in the corner display area; and
   a thin-film encapsulation layer covering the corner display element and the intermediate display element, the thin-film encapsulation layer comprising at least one inorganic encapsulation layer and at least one organic encapsulation layer,
   wherein the at least one organic encapsulation layer is separated based on the dam portion, and
   wherein the second groove is filled with the at least one organic encapsulation layer.

5. The display panel of claim 4, further comprising an auxiliary dam portion on the lower layer, arranged in the intermediate display area, and protruding in the thickness direction of the substrate,
   wherein a first distance from an upper surface of the substrate to an upper surface of the auxiliary dam portion is less than a second distance from the upper surface of the substrate to an upper surface of the dam portion, and
   wherein the auxiliary dam portion extends in parallel with the dam portion, the auxiliary dam portion comprising a first auxiliary dam portion and a second auxiliary dam portion that are separated from each other.

6. The display panel of claim 1, further comprising:
   a driving circuit arranged in the intermediate display area, the driving circuit overlapping the intermediate display element;
   a pixel circuit in the front display area; and
   a connection line connected to the pixel circuit, the connection line extending from the front display area to the intermediate display area,
   wherein the connection line is connected to the pixel electrode.

7. The display panel of claim 1, wherein the lower layer comprises:
   a lower inorganic pattern layer; and
   an insulating layer covering an edge of the lower inorganic pattern layer, the insulating layer comprising a hole exposing at least a portion of the lower inorganic pattern layer, and
   wherein the groove is defined by the lower inorganic pattern layer and the hole.

8. The display panel of claim 7, further comprising a line on the substrate,
   wherein the line is covered with the lower inorganic pattern layer and the insulating layer.

9. The display panel of claim 1, wherein the lower layer comprises an insulating layer including a concave portion, and
   wherein the second groove is defined by the concave portion of the insulating layer.

10. The display panel of claim 1, further comprising an inorganic pattern layer arranged on both sides of the first groove, the inorganic pattern layer comprising a pair of protruding tips protruding in a center direction of the groove.

11. A display panel comprising:
    a substrate comprising a front display area and an intermediate display area, the intermediate display area at least partially surrounding the front display area;
    a pixel circuit in the front display area;
    a driving circuit in the intermediate display area;
    an intermediate display element overlapping with the driving circuit, the intermediate display element comprising a pixel electrode connected to the pixel circuit;
    a lower layer arranged between the substrate and the pixel electrode, the lower layer comprising a groove concave in a thickness direction of the substrate;
    a dam portion on the lower layer, arranged outside the intermediate display area, and protruding in the thickness direction of the substrate; and
    a thin-film encapsulation layer covering the intermediate display element and extending to the dam portion, the thin-film encapsulation layer comprising at least one inorganic encapsulation layer and at least one organic encapsulation layer,
    wherein the groove comprises a first groove and a second groove, the first groove extending in parallel with the dam portion, and the second groove extending in a direction crossing a direction in which the dam portion extends in the intermediate display area, and
    wherein the second groove is filled with the at least one organic encapsulation layer.

12. A display device comprising:
a display panel comprising:
a substrate comprising:
a front display area;
a corner display area arranged and bent at a corner of the front display area; and
an intermediate display area between the front display area and the corner display area;
an intermediate display element arranged in the intermediate display area, the intermediate display element comprising a pixel electrode;
a lower layer arranged between the substrate and the pixel electrode, the lower layer comprising a groove concave in a thickness direction of the substrate; and
a dam portion on the lower layer, extending to define a boundary between the intermediate display area and the corner display area, and protruding in the thickness direction of the substrate; and
a cover window covering the display panel,
wherein the groove comprises a first groove and a second groove, the first groove extending in parallel with the dam portion, and the second groove extending in a direction crossing a direction in which the dam portion extends in the intermediate display area.

13. The display device of claim 12, wherein the corner display area comprises a plurality of extension areas each extending from the intermediate display area,
wherein the intermediate display element comprises a first intermediate display element and a second intermediate display element each facing the plurality of extension areas, and
wherein the second groove extends between the first intermediate display element and the second intermediate display element.

14. The display device of claim 12, wherein a plurality of intermediate display elements are in the intermediate display area, and
wherein the second groove surrounds at least a portion of each of the plurality of intermediate display elements.

15. The display device of claim 12, wherein the display panel further comprises:
a corner display element in the corner display area; and
a thin-film encapsulation layer covering the corner display element and the intermediate display element, the thin-film encapsulation layer comprising at least one inorganic encapsulation layer and at least one organic encapsulation layer,
wherein the at least one organic encapsulation layer is separated based on the dam portion, and
wherein the second groove is filled with the at least one organic encapsulation layer.

16. The display device of claim 15, wherein the display panel further comprises an auxiliary dam portion on the lower layer, arranged in the intermediate display area, and protruding in the thickness direction of the substrate,
wherein a first distance from an upper surface of the substrate to an upper surface of the auxiliary dam portion is less than a second distance from the upper surface of the substrate to an upper surface of the dam portion, and
wherein the auxiliary dam portion extends in parallel with the dam portion, the auxiliary dam portion comprising a first auxiliary dam portion and a second auxiliary dam portion that are separated from each other.

17. The display device of claim 12, wherein the display panel further comprises:
a driving circuit arranged in the intermediate display area, the driving circuit overlapping the intermediate display element;
a pixel circuit in the front display area; and
a connection line connected to the pixel circuit, the connection line extending from the front display area to the intermediate display area, and
wherein the connection line is connected to the pixel electrode.

18. The display device of claim 12, wherein the lower layer comprises:
a lower inorganic pattern layer; and
an insulating layer covering an edge of the lower inorganic pattern layer, the insulating layer comprising a hole exposing at least a portion of the lower inorganic pattern layer, and
wherein the groove is defined by the lower inorganic pattern layer and the hole.

19. The display device of claim 12, wherein the lower layer comprises an insulating layer comprising a concave portion, and
wherein the second groove is defined by the concave portion of the insulating layer.

20. The display device of claim 12, wherein the substrate further comprises:
a first side display area connected to the front display area in a first direction and bent with a first curvature radius; and
a second side display area connected to the front display area in a second direction crossing the first direction and bent with a second curvature radius that is different from the first curvature radius, and
wherein the corner display area is between the first side display area and the second side display area and surrounds the front display area.

21. A display panel comprising:
a substrate comprising:
a front display area;
a first side display area extending in a first direction from the front display area;
a second side display area extending, from the front display area, in a second direction crossing the first direction;
a corner display area between the first side display area and the second side display area; and
an intermediate display area between the front display area and the corner display area;
at least one pixel arranged in the intermediate display area, the at least one pixel comprising a display element comprising a pixel electrode;
a lower layer arranged between the substrate and the pixel electrode, the lower layer comprising a groove concave in a thickness direction of the substrate; and
a dam portion on the lower layer, arranged to define a boundary between the at least one pixel and the corner display area, and protruding in the thickness direction of the substrate,
wherein the at least one pixel comprises a first intermediate pixel and a second intermediate pixel each facing the corner display area, and
wherein the groove comprises a first groove arranged in parallel with the dam portion, and a second groove between the first intermediate pixel and the second intermediate pixel.

* * * * *